(12) United States Patent
Kim et al.

(10) Patent No.: US 10,784,216 B2
(45) Date of Patent: Sep. 22, 2020

(54) SEMICONDUCTOR DEVICE AND SEMICONDUCTOR PACKAGE INCLUDING THE SAME

(71) Applicant: Samsung Electronics Co., Ltd., Suwon-si (KR)

(72) Inventors: Won-Young Kim, Seoul (KR); Sun-Won Kang, Seongnam-si (KR); Jin-Chan Ahn, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/393,135

(22) Filed: Apr. 24, 2019

(65) Prior Publication Data

US 2019/0252332 A1      Aug. 15, 2019

Related U.S. Application Data

(63) Continuation of application No. 15/295,104, filed on Oct. 17, 2016, now Pat. No. 10,297,559.

(30) Foreign Application Priority Data

Nov. 10, 2015      (KR) .................. 10-2015-0157439

(51) Int. Cl.
*H01L 23/00* (2006.01)

(52) U.S. Cl.
CPC .............. *H01L 24/02* (2013.01); *H01L 24/05* (2013.01); *H01L 24/73* (2013.01); *H01L 24/16* (2013.01);
(Continued)

(58) Field of Classification Search
None
See application file for complete search history.

(56) References Cited

U.S. PATENT DOCUMENTS

| 6,780,748 B2 | 8/2004 | Yamaguchi et al. |
| 7,550,830 B2 | 6/2009 | Yoon |

(Continued)

FOREIGN PATENT DOCUMENTS

| JP | 4068838 | 3/2008 |
| KR | 100895818 | 5/2009 |
| KR | 101006521 | 1/2011 |

OTHER PUBLICATIONS

"Semiconductor Device and Semiconductor Package Including the Same" Specification, Drawings and Prosecution History of U.S. Appl. No. 15/295,104, filed Oct. 17, 2016, by Won-young Kim, et al.

*Primary Examiner* — Moazzam Hossain
*Assistant Examiner* — Stanetta D Isaac
(74) *Attorney, Agent, or Firm* — Onello & Mello, LLP

(57) ABSTRACT

Provided are a semiconductor device and a semiconductor package including the same. The semiconductor device comprises a semiconductor chip body including a first chip pad on a top surface, a passivation film disposed on the semiconductor chip body and a first redistribution layer that is disposed between the passivation film and the semiconductor chip body with an opening to expose a first chip center pad region at least partially overlapping the first chip pad, a first redistribution center pad region connected to the first chip center pad region, and a first edge pad region spaced apart from the first redistribution center pad region, through the passivation film, wherein a top surface of the first chip center pad region and a top surface of the first redistribution center pad region are not disposed on the same plane.

20 Claims, 21 Drawing Sheets

(52) U.S. Cl.
CPC ............ *H01L 24/29* (2013.01); *H01L 24/45* (2013.01); *H01L 24/48* (2013.01); *H01L 2224/0233* (2013.01); *H01L 2224/0235* (2013.01); *H01L 2224/02166* (2013.01); *H01L 2224/02373* (2013.01); *H01L 2224/02375* (2013.01); *H01L 2224/02379* (2013.01); *H01L 2224/02381* (2013.01); *H01L 2224/04073* (2013.01); *H01L 2224/13101* (2013.01); *H01L 2224/16225* (2013.01); *H01L 2224/2919* (2013.01); *H01L 2224/32225* (2013.01); *H01L 2224/45147* (2013.01); *H01L 2224/4824* (2013.01); *H01L 2224/48091* (2013.01); *H01L 2224/73204* (2013.01); *H01L 2224/73207* (2013.01); *H01L 2224/73215* (2013.01); *H01L 2224/73265* (2013.01)

(56) References Cited

U.S. PATENT DOCUMENTS

| | | |
|---|---|---|
| 7,646,087 B2 | 1/2010 | Tu et al. |
| 7,863,759 B2 | 1/2011 | Wu |
| 8,188,606 B2 | 5/2012 | Alvarado et al. |
| 8,710,656 B2 | 4/2014 | Daubenspeck et al. |
| 9,355,975 B2 | 5/2016 | Ho et al. |
| 9,437,478 B2 | 9/2016 | Ho et al. |
| 2003/0109079 A1 | 6/2003 | Yamaguchi et al. |
| 2008/0088018 A1 | 4/2008 | Yoon |
| 2009/0065924 A1 | 3/2009 | Kim et al. |
| 2013/0299966 A1 | 11/2013 | Kumar et al. |
| 2014/0332908 A1 | 11/2014 | Ho et al. |
| 2014/0332969 A1 | 11/2014 | Ho et al. |
| 2015/0108604 A1 | 4/2015 | Nakamura |
| 2015/0318265 A1 | 11/2015 | Isa |

SEMICONDUCTOR DEVICE AND SEMICONDUCTOR PACKAGE INCLUDING THE SAME

CROSS REFERENCE TO RELATED APPLICATIONS

The present application is a continuation application of U.S. patent application Ser. No. 15/295,104, filed on Oct. 17, 2016, which claims under 35 U.S.C. 119 priority to and the benefit of Korean Patent Application No. 10-2015-0157439 filed on Nov. 10, 2015 in the Korean Intellectual Property Office, the disclosure of which is incorporated by reference herein.

BACKGROUND

1. Technical Field

Inventive concepts relate to a semiconductor device and a semiconductor package including the same. More particularly, inventive concepts relate to a semiconductor device include a redistribution layer and a semiconductor package including the same.

2. Description of the Related Art

A semiconductor package may include a semiconductor device that is capable of storing a huge amount of data and processing that data in a short time. Such a device may include a circuit unit for storing and/or processing data and chip pads for inputting data to the circuit from "the outside" (that is, outside the circuit unit) or outputting data from the circuit unit to the outside.

Some semiconductor devices include one or more redistribution layers connected to the chip pads, in order to change the positions of pads disposed at a specified position of the semiconductor device (that is, to alter the location through which the pads connect to the outside).

For example, when the pads are disposed in a region of a top surface of the semiconductor device, the electrical connection points, the points where the circuit unit makes connection through pads with wires or bumps, may be changed to other regions of the top surface of the semiconductor device through a redistribution layer electrically connected to the chip pads. Such redistribution may be employed, for example, to ease crowding in one area of a circuit or, generally, for convenient placement of pads.

When a defect, such as short-circuit, occurs in a redistribution layer that electrically connects the outside and the semiconductor device, the defect may also occur in the semiconductor device and even in the semiconductor package including the same.

Therefore, for the reliability of electrical connections between the semiconductor device, or circuit unit, and the outside, the reliability of the redistribution layer is critical.

SUMMARY

Aspects of inventive concepts provide a semiconductor device with improved reliability and a semiconductor package including the same.

Aspects of inventive concepts provide a semiconductor device capable of stably maintaining the electrical connection to the outside, and a semiconductor package including the same.

Aspects of inventive concepts provide a semiconductor device capable of stably maintaining the electrical connection to the outside even when a defect occurs in the redistribution layer, and a semiconductor package including the same.

Aspects of the inventive concepts provide a semiconductor device, the semiconductor device comprises a semiconductor chip body including a first chip pad on a top surface, a passivation film disposed on the semiconductor chip body and a first redistribution layer that is disposed between the passivation film and the semiconductor chip body to expose a first chip center pad region at least partially overlapping the first chip pad, a first redistribution center pad region connected to the first chip center pad region, and a first edge pad region spaced apart from the first redistribution center pad region, through the passivation film, wherein a top surface of the first chip center pad region and a top surface of the first redistribution center pad region are not disposed on the same plane.

In some example embodiments, the first redistribution center pad region and the first chip center pad region are connected to each other to have a profile continuous with each other.

In some example embodiments, a top surface of the first redistribution center pad region and a bottom surface of the first chip center pad region are in a rectangular form that shares a first side each other.

In some example embodiments, the semiconductor device further comprises an insulating film disposed between the first redistribution center pad region and the semiconductor chip body, wherein the top surface of the first chip pad is exposed through the insulating film.

In some example embodiments, the first chip center pad region comprises a first center region, and a first peripheral region that connects the first center region with the first redistribution center pad region, and the top surface of the first center region and the top surface of the first redistribution center pad region are not disposed on the same plane.

In some example embodiments, the top surface of the first redistribution center pad region has an area wider than the top surface of the first center region.

In some example embodiments, the semiconductor chip body comprises a central region, a first edge region adjacent to an edge of the semiconductor chip body, and a first redistribution region that connects the central region and the first edge region, the first chip center pad region and the first redistribution center pad region are disposed in the central region, and the first edge pad region is disposed in the first edge region.

In some example embodiments, the first redistribution center pad region is disposed between the first chip center pad region and the first edge pad region.

In some example embodiments, the first chip center pad region is disposed between the first redistribution center pad region and the first edge pad region.

In some example embodiments, the first redistribution layer extends on the semiconductor chip body along a first direction, and the first redistribution center pad region further comprises first and second sub-center pad regions that are disposed along the first direction around the first chip center pad region.

Aspects of the inventive concepts provide a semiconductor device, the semiconductor device comprises a semiconductor chip body including a first chip pad, an insulating film that is disposed on the semiconductor chip body to expose a top surface of the first chip pad, a first redistribution layer that extends on a top surface of the first chip pad in a first direction and a passivation layer that is disposed in the first redistribution layer to expose a first chip center pad region of a first redistribution layer overlapping the first chip pad, a first redistribution center pad region of the first redistribution layer connected to the first chip center pad region and disposed on the insulating film, and a first edge pad region of the first redistribution layer adjacent to an edge of the semiconductor chip body, wherein the first chip center pad region comprises a first center region, and a first peripheral region that connects the first center region with the first redistribution center pad region, and a top surface of the first center region and a top surface of the first redistribution center pad region are not disposed on the same plane, and the top surface of the first redistribution center pad region has an area wider than the top surface of the first center region.

In some example embodiments, the first redistribution center pad region and the first chip center pad region are connected to each other to have a profile continuous with each other.

In some example embodiments, the semiconductor chip body comprises a central region, a first edge region adjacent to an edge of the semiconductor chip body, and a first redistribution region which connects the central region with the first edge region, the first chip center pad region and the first redistribution center pad region are disposed in the central region, and the first edge pad region is disposed in the first edge region.

Aspects of the inventive concepts provide a semiconductor package, the semiconductor package comprises a package substrate including a first top pad on a top surface and a semiconductor chip disposed on the package substrate, wherein the semiconductor chip comprises a semiconductor chip body including a first chip pad on a top surface, a passivation film disposed on the semiconductor chip body, and a first redistribution layer disposed between the passivation film and the semiconductor chip body, and the first redistribution layer exposes a first chip center pad region at least partially overlapping the first chip pad, a first redistribution center pad region connected to the first chip center pad region, and a first edge pad region spaced apart from the first redistribution center pad region through the passivation film, and a top surface of the first chip center pad region and a top surface of the first redistribution center pad region are not disposed on the same plane.

In some example embodiments, the semiconductor package further comprises a wire that electrically connects the first top pad and the first redistribution center pad region.

In some example embodiments, the semiconductor package further comprises a first flip pad disposed on the first redistribution center pad region, and a first bump disposed between the first flip pad and the first top pad.

In some example embodiments, the first redistribution center pad region and the first chip center pad region are connected to each other to have a profile continuous with each other.

In some example embodiments, the semiconductor package further comprises an insulating film disposed between the first redistribution center pad region and the semiconductor chip body, wherein the top surface of the first chip pad is exposed through the insulating film.

In some example embodiments, the first chip center pad region comprises a first center region, and a first peripheral region that connects the first center region with the first redistribution center pad region, and the top surface of the first center region and the top surface of the first redistribution center pad region are not disposed on the same plane.

In some example embodiments, the top surface of the first redistribution center pad region has an area wider than the top surface of the first center region.

In example embodiments a semiconductor device includes a semiconductor chip body including a chip pad on a top surface; an insulation film on the top surface of the semiconductor chip body patterned to leave at least a portion of the chip pad exposed; a redistribution layer on the insulation film that contacts at least a portion of the chip pad exposed through the patterned insulation film to form a chip pad region; and a passivation layer on the redistribution layer patterned to leave at least a portion of the chip pad region exposed and to leave a portion of the redistribution layer adjacent the chip pad region exposed to thereby form an auxiliary pad region.

In example embodiments a semiconductor device includes a semiconductor chip body including a chip pad on a top surface; an insulation film on the top surface of the semiconductor chip body patterned to leave at least a portion of the chip pad exposed; a redistribution layer on the insulation film that contacts at least a portion of the chip pad exposed through the patterned insulation film to form a chip pad region; and a passivation layer on the redistribution layer patterned to leave at least a portion of the chip pad region exposed and to leave a portion of the redistribution layer adjacent the chip pad region exposed to thereby form an auxiliary pad region and a wire electrically connected to the auxiliary pad region.

In example embodiments a semiconductor device includes a semiconductor chip body including a chip pad on a top surface; an insulation film on the top surface of the semiconductor chip body patterned to leave at least a portion of the chip pad exposed; a redistribution layer on the insulation film that contacts at least a portion of the chip pad exposed through the patterned insulation film to form a chip pad region; and a passivation layer on the redistribution layer patterned to leave at least a portion of the chip pad region exposed and to leave a portion of the redistribution layer adjacent the chip pad region exposed to thereby form an auxiliary pad region and a flip pad disposed on the auxiliary pad region.

In example embodiments a semiconductor device includes a semiconductor chip body including a chip pad on a top surface; an insulation film on the top surface of the semiconductor chip body patterned to leave at least a portion of the chip pad exposed; a redistribution layer on the insulation film that contacts at least a portion of the chip pad exposed through the patterned insulation film to form a chip pad region; and a passivation layer on the redistribution layer patterned to leave at least a portion of the chip pad region exposed and to leave a portion of the redistribution layer adjacent the chip pad region exposed to thereby form an auxiliary pad region, wherein the exposed area of the auxiliary pad region is greater than the area of the chip region.

In example embodiments a semiconductor device includes a semiconductor chip body including a chip pad on a top surface; an insulation film on the top surface of the semiconductor chip body patterned to leave at least a portion of the chip pad exposed; a redistribution layer on the insulation film that contacts at least a portion of the chip pad exposed through the patterned insulation film to form a chip pad region; and a passivation layer on the redistribution layer patterned to leave at least a portion of the chip pad region exposed and to leave a portion of the redistribution layer adjacent the chip pad region exposed to thereby form an auxiliary pad region, wherein, the chip pad region is within a depression formed by an opening in the insulation layer, and its top and bottom surfaces are at lower levels that the respective top and bottom surfaces of the redistribution layer located atop the insulation layer; and the auxiliary chip pad region is at the same level as the redistribution layer, with its top and bottom surfaces at the same levels as the respective top and bottom surfaces of the redistribution layer.

BRIEF DESCRIPTION OF THE DRAWINGS

The above and other aspects and features of the inventive concepts will become more apparent by describing in detail exemplary embodiments thereof with reference to the attached drawings, in which.

DETAILED DESCRIPTION OF THE EMBODIMENTS

Figure 1:
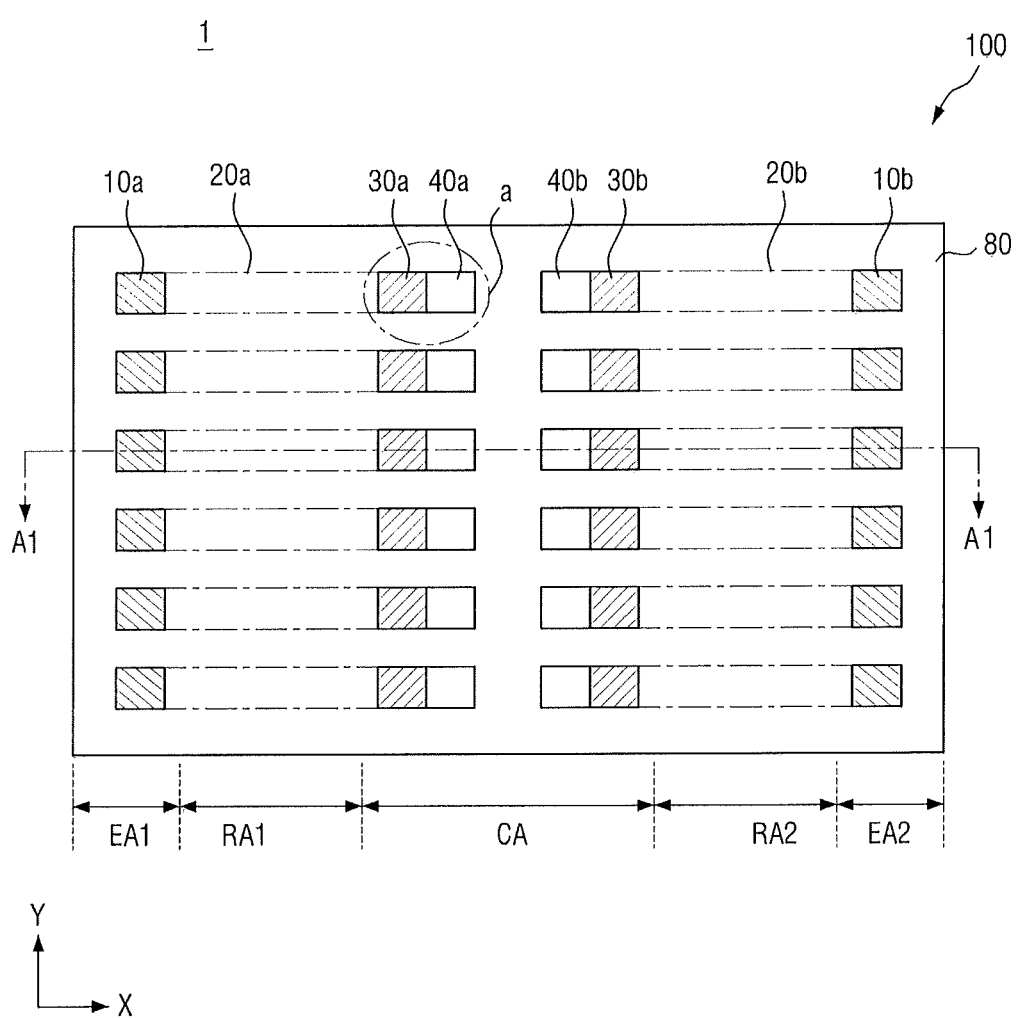
FIG. 1 is a perspective view for describing a semiconductor device according to some example embodiments of the inventive concepts.

Advantages and features of inventive concepts and methods of accomplishing the same may be understood more readily by reference to the following detailed description of example embodiments and the accompanying drawings. Inventive concepts may, however, be embodied in many different forms and should not be construed as being limited to the embodiments set forth herein. Rather, these embodiments are provided so that this disclosure will be thorough and complete and will fully convey the concept of the disclosure to those skilled in the art, and inventive concepts will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, and the like may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Hereinafter, a semiconductor device and a semiconductor package including the same in accordance with principles of inventive concepts will be described by way of several examples.

In example embodiments in accordance with principles of inventive concepts a semiconductor package may include an auxiliary pad that may be employed, for example, for bonding, such as wire-bonding or bump bonding, to carry electrical signals to "the outside" (that is, off-chip) or for test probing.

In an example embodiment a redistribution layer makes contact with a chip pad on a semiconductor device, or chip, though an opening in an insulation layer. A passivation layer is patterned over the redistribution layer, leaving the portion of the redistribution layer that overlies the chip pad exposed to form a chip pad region and an adjacent auxiliary pad region. Because the chip pad region is within the depression formed by an opening in the insulation layer, its top and bottom surfaces are at lower levels that the respective top and bottom surfaces of the redistribution layer located atop the insulation layer. The auxiliary chip pad region, though, is at the same level as the redistribution layer, with its top and bottom surfaces at the same levels as the respective top and bottom surfaces of the redistribution layer. Additionally, the auxiliary chip pad region may have a larger surface area exposed than its adjacent chip pad. A semiconductor device according to some example embodiments in accordance with principles of inventive concepts will be described referring to FIGS. 1 to 3.

Figure 2:
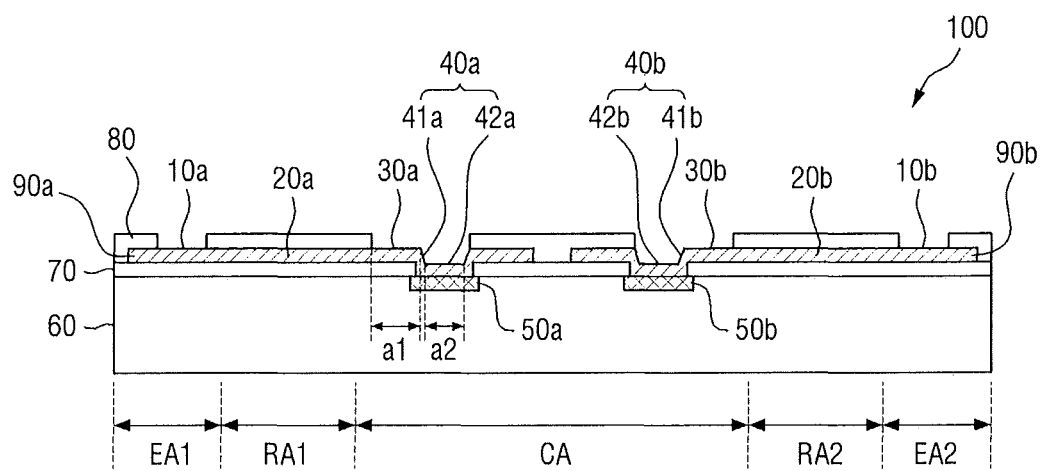
FIG. 2 is a cross-sectional view taken along the line A1-A1 of FIG. 1.
Figure 3:
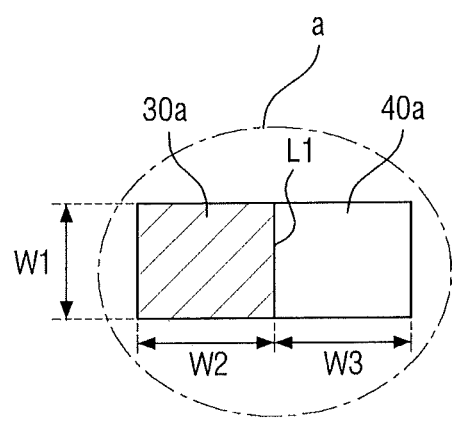
FIG. 3 is an enlarged perspective view of a region of a dotted line 'a' of FIG. 1.

FIG. 1 is a perspective view for describing an example embodiment of a semiconductor device in accordance with principles of inventive concepts. FIG. 2 is a cross-sectional view taken along the line A1-A1 of FIG. 1. FIG. 3 is an enlarged perspective view of a region of a dotted line 'a' of FIG. 1.

Referring to FIGS. 1 to 3, a semiconductor device 1 includes a semiconductor chip body 60, an insulating film 70, a passivation film 80, a first redistribution layer 90a and a second redistribution layer 90b.

The semiconductor chip body 60 may include an integrated circuit element. For example, the integrated circuit element may include a memory element or a logic device (e.g., a processor). The semiconductor chip body 60 may include various internal circuit patterns and internal wirings, and may electrically connect first chip pad 50a and the second chip pad 50b with the internal circuit patterns through the internal wirings.

The semiconductor chip body 60 may house the internal circuit pattern and the internal wirings, using an interlayer insulating film that includes at least one of oxide, nitride and oxynitride. Moreover, a low-dielectric constant material may be used as the interlayer insulating film to reduce a coupling effect between the internal wirings, and the interlayer insulating film may be made of, for example, flowable oxide (FOX), tonen silazen (TOSZ), undoped silica glass (USG), borosilica glass (BSG), phosphosilaca glass (PSG), borophosphosilica glass (BPSG), plasma enhanced tetra ethyl ortho silicate (PRTEOS), fluoride silicate glass (FSG), high density plasma (HDP), plasma enhanced oxide (PEOX), flowable CVD (FCVD) or a combination thereof.

In exemplary embodiments in accordance with principles of inventive concepts, the semiconductor chip body 60 may be divided into a first edge region EA1, a first redistribution region RA1, a central region CA, a second redistribution region RA2 and a second edge region EA2.

That is, referring to FIG. 1, for example, the semiconductor chip body 60 includes a first edge region EA1 adjacent to one edge side surface of the semiconductor chip body 60, and a second edge region EA2 adjacent to the other edge side surface facing the one edge side surface. First redistribution region RA1 may be disposed between the central region CA and the first edge region EA1 of the semiconductor chip body 60, and second redistribution region RA2 may be disposed between the central region CA and the second edge region EA2.

In this example embodiment, when the semiconductor chip body 60 is viewed from the top, as illustrated in FIG. 1, although it is illustrated in a rectangular shape, inventive concepts are not limited thereto.

Thus, even when the shape of the semiconductor chip body 60 is a circular, elliptical, shape or another type of polygonal shape, as long as the semiconductor chip body 60 includes edges, as described above, the semiconductor chip body 60 may be divided into the first edge region EA1, the first redistribution region RA1, the central region CA, the second redistribution region RA2 and the second edge region EA2.

The first chip pad 50a and the second chip pad 50b are disposed on the top surface of the semiconductor chip body 60.

The first chip pad 50a and the second chip pad 50b may be disposed in the central region CA. However, the above-mentioned arrangement is an example for explaining this embodiment and inventive concepts are not limited thereto. Thus, the first chip pad 50a and the second chip pad 50b may be disposed in any region, such as the first edge region EA1, the first redistribution region RA1, the second redistribution region RA2 and the second edge region EA2, except the central region CA.

Although the first chip pad 50a and the second chip pad 50b are inserted into the semiconductor chip body 60 and their top surfaces are illustrated in an exposed form in FIG. 2, the arrangement of the first chip pad 50a and the second chip pad 50b on the semiconductor chip body 60 is not limited thereto. Thus, the first chip pad 50a and the second chip pad 50b may be in a shape that protrudes toward the top surface of the semiconductor chip body 60, for example.

The first chip pad 50a and the second chip pad 50b may be formed of aluminum containing a conductive material, for example.

An insulating film 70 that exposes (that is, that leaves exposed) the first chip pad 50a and the second chip pad 50b may be disposed on the semiconductor chip body 60.

The insulating film 70 may be disposed throughout the first edge region EA1, the first redistribution region RA1, the central region CA, the second redistribution region RA2 and the second edge region EA2.

The insulating film 70 may expose (that is, leave exposed) the top surfaces of each of the first chip pad 50a and the second chip pad 50b. That is, the exposed regions of the first chip pad 50a and the second chip pad 50b may be defined through the insulating film 70.

The insulating film 70 may contain at least one of oxide, nitride and oxynitride or may be made of flowable oxide (FOX), tonen silazen (TOSZ), undoped silica glass (USG), borosilica glass (BSG), phosphosilaca glass (PSG), borophosphosilica glass (BPSG), plasma enhanced tetra ethyl ortho silicate (PRTEOS), fluoride silicate glass (FSG), high density plasma (HDP), plasma enhanced oxide (PEOX), flowable CVD (FCVD) or a combination thereof. Although the insulating film 70 is illustrated as a single layer, inventive concepts are not limited thereto.

The semiconductor chip body 60 may be protected using the insulating film 70, thereby blocking electrical interference between the semiconductor chip body 60 and the first and second redistribution layers 90a and 90b disposed on the semiconductor chip body 60. The first redistribution layer 90a and the second redistribution layer 90b are disposed on the insulating film 70.

The first redistribution layer 90a and the second redistribution layer 90b may extend along a first direction X. If each of a plurality of first redistribution layers 90a and second redistribution layers 90b may be disposed, the plurality of first redistribution layers 90a and the second redistribution layers 90b may be disposed side by side with each other along a second direction Y.

Because the first and second redistribution layers 90a, 90b function as interconnections that form an electrical connection, they are formed of a material with high electrical conductivity. For example, the first and second redistribution layers 90a, 90b may contain titanium (Ti), copper (Cu) and nickel (Ni). In some example embodiments, the first and second redistribution layers 90a, 90b may be formed of a thin film on which several kinds of metal are deposited to ensure excellent electrical conductivity, adhesion characteristics, protection characteristics and the like.

The first redistribution layer 90a may include a first chip center pad region 40a, a first redistribution center pad region 30a, a first connection region 20a and a first edge pad region 10a, and the second redistribution layer 90b may include a second chip center pad region 40b, a second redistribution center pad region 30b, a second connection region 20b and a second edge pad region 10b.

The first and second chip center pad regions 40a, 40b are regions for meter-reading the defect of the semiconductor device 1 Therefore, even in future processes, the top surfaces of the first and second chip center pad regions 40a, 40b maintain an open state for meter-reading (that is, they are left exposed for test-probing).

In this example embodiment, referring to FIG. 1, the chip center pad region is divided into first and second chip center pad regions 40a, 40b, the redistribution center pad regions is divided into first and second redistribution center pad regions 30a, 30b, the connection region is divided into first and second connection regions 20a, 20b and the edge pad region is divided into first and second edge pad regions 10a, 10b in this example embodiment. This is an example to dividedly illustrate each of the constituent elements, and does not mean that the constituent elements are formed of different materials or forms.

In this example embodiment, although each of six first redistribution layers 90a and second redistribution layers 90b are illustrated as being disposed on the semiconductor chip body 60, inventive concepts are not limited thereto.

That is, the number of the first redistribution layers 90a and the second redistribution layers 90b disposed on the semiconductor chip body 60 may be variously determined, depending on the number of chip pads included in the semiconductor chip body 60 and the needs of the user.

In example embodiments, the first redistribution layer 90a may extend through the central region CA, the first redistribution region RA1 and the first edge region EA1, along the first direction X. The second redistribution layer 90b may extend throughout the central region CA, the second redistribution region RA2 and the second edge region EA2 along the first direction X. That is, the first redistribution layer 90a and the second redistribution layer 90b may extend in the opposite directions to each other from the central region CA. However, inventive concepts are not limited thereto.

The first redistribution layer 90a may be electrically connected to the first chip pad 50a in the central region CA. In example embodiments, the first redistribution layer 90a may be directly in contact with the first chip pad 50a with the top surface exposed through the insulating film 70 in the central region CA, and may be electrically connected thereto. However, example embodiments are not limited thereto, and an additional metal layer may be disposed between the first redistribution layer 90a and the first chip pad 50a, for example.

A passivation film 80 is formed on the first redistribution layer 90a and the second redistribution layer 90b.

The passivation film 80 may expose respective partial regions of the first redistribution layers 90a and the second the redistribution layers 90b to define the first and second chip center pad regions 40a, 40b, the first and second redistribution center pad regions 30a, 30b and the first and second edge pad regions 10a, 10b.

In example embodiments, an overlap region between the first redistribution layer 90a and the exposed top surface of the first chip pad 50a may be the first chip center pad region 40a. The first chip center pad region 40a may include a first center region 42a and a first peripheral region 41a. The peripheral region 41a may wrap, or surround, at least a part of the first center region 42a.

In example embodiments the first center region 42a is parallel to the first chip pad 50a (that is, top and bottom surfaces of the first center region 42a are parallel to the top surface of the first chip pad 50a) and may include a flat top surface, and the peripheral region 41a may include a sloped side wall.

The region of the first redistribution layer 90a connected to the first chip center pad region 40a through the peripheral region 41a and disposed on the insulating film 70 may be a first redistribution center pad region 30a. That is, the first redistribution center pad region 30a is disposed on the insulating film 70 and, unlike the first chip center pad region 40a, the first redistribution center pad region 30a may have a step different from the first center region 42a. The first peripheral region 41a may include a sloped side wall due to the step.

That is, the top surface of the first chip center pad region 40a and the top surface of the first redistribution center pad region 30a may not be disposed on the same plane. In example embodiments, the top surface of the first chip center pad region 40a refers to all of the top surface of the first peripheral region 41a and the top surface of the first center region 42a. Additionally, the expression "not disposed on the same plane" refers to the fact that, in this example embodiment, the top surface of the first redistribution center pad region 30a and the top surface of the first center region 42a of the first chip center pad region 40a are side by side but at different levels.

Although the side walls of the peripheral region 41a are illustrated as having a certain slope, inventive concepts are not limited thereto. For example, the peripheral region 41a may include side walls perpendicular to the top surface of the first center region 42a or the top surface of the first redistribution center pad region 30a.

The form viewed from the top surface of the first chip center pad region 40a and/or the first center region 42a may be the form corresponding to the first chip pad 50a. That is, when the form of the first chip pad 50a is a rectangular form, the form of the first chip center pad region 40a and/or the first center region 42a may be a rectangular form corresponding to the form of the first chip pad 50a. Thus, the first chip center pad region 40a may ensure the maximum contact area with the first chip pad 50a.

In example embodiments, the passivation film 80 may be formed of a polymer material such as photosensitive polyimide (PSPI), benzo-cyclo-butene (BCB) and epoxy.

Referring to FIG. 2 again, the first redistribution center pad region 30a is parallel to the first chip pads 50a (that is the top and bottom surfaces of the center pad region 30a may be parallel to the top and bottom surfaces of the first chip pads 50a). The first redistribution center pad region 30a may include a flat top surface, and the top surface may have a first length a1 and the top surface of the first center region 42a may have a second length a2.

In example embodiments, the first length a1 is greater than the second length a2. That is, an opening in the passivation film 80 may expose the first redistribution center pad region 30a so that the first length a1 is greater than the second length a2.

In some example embodiments of the present disclosure, the first redistribution center pad region 30a may be a wire bonding region or a flip bonding region for packaging the semiconductor. Because the first length a1 is greater than the second length a2, the first redistribution center pad region 30a may provide a bonding region that allows a more stable bonding, as compared to the first chip center pad region 40a. Because, in example embodiments in accordance with principles of inventive concepts it is possible to stably maintain the electrical connection between the semiconductor device 1 and the outside using the larger surface area of first redistribution center pad region 30a, it is possible to improve the reliability of the semiconductor device 1 and the semiconductor package including the same.

The first redistribution layer 90a may include a first connection region 20a that is connected to the first redistribution center pad region 30a and is disposed between the passivation film 80 and the insulating film 70. The first connection region 20a may be disposed in the first redistribution region RA1. The first connection region 20a may electrically connect the first redistribution center pad region 30a and the first edge pad region 10a.

The first redistribution layer 90a may include a first edge pad region 10a with a top surface exposed to (that is, exposed through) the passivation film 80. The first edge pad region 10a may be disposed in the first edge region EA1.

The first edge pad region 10a may be a wire bonding region or a flip bonding region for packaging the semiconductor, for example. Unlike the illustrated configuration, an additional metal layer may be disposed on the first edge pad region 10a to form the wire bonding or the flip bonding.

An overlap region between the second redistribution layer 90b and the exposed top surface of the second chip pad 50b may be the second chip center pad region 40b. The second chip center pad region 40b may include a second center region 42b and a second peripheral region 41b. The second peripheral region 41b may be in the form of wrapping at least a part of the second center region 42b.

The second center region 42b is parallel to the second chip pad 50b (that is, top and bottom surfaces of second center region 42b may be parallel to top and bottom surfaces of second chip pad 50b). In example embodiments the second center region may include a flat top surface that, and the second peripheral region 41b may include a sloped side wall.

The region of the second redistribution layer 90b connected to the second chip center pad region 40b through the second peripheral region 41b and disposed on the insulating film 70 may be a second redistribution center pad region 30b. That is, the second redistribution center pad region 30b is disposed on the insulating film 70. Unlike the second chip center pad region 40b, the second redistribution center pad region 30b may have a step different from the first center region 42b. That is, the second peripheral region 41b of center pad region 40b may include a sloped side wall due to a step between the level of second center region 42b and second redistribution center pad region 30b, which is due, in turn to the second redistribution center pad region being disposed on the insulating film 70 while the second center region 42b is not.

That is, the top surface of the second chip center pad region 40b and the top surface of the second redistribution center pad region 30b may not be disposed on the same plane. In example embodiments, the top surface of the second chip center pad region 40b refers to all of the top surface of the second peripheral region 41b and the top surface of the second center region 42b. Additionally, the expression "not disposed on the same plane" refers to the fact that, in this example embodiment, the top surface of the second redistribution center pad region 30b and the top surface of the second center region 42b of the second chip center pad region 40b are side by side, but at different levels.

Although the side walls of the second peripheral region 41b are illustrated as having a particular slope, inventive concepts are not limited thereto. For example, the second peripheral region 41b may include side walls perpendicular to the top surface of the second center region 42b or the top surface of the second redistribution center pad region 30b.

The form viewed from the top surface of the first chip center pad region 40b and/or the first center region 42b may be a form corresponding to the first chip pad 50b. That is, when the form of the first chip pad 50b is a rectangular form, the form of the first chip center pad region 40b and/or the first center region 42b may be a rectangular form corresponding to the form of the first chip pad 50b. The first chip center pad region 40b may ensure the maximum contact area with the first chip pad 50b.

The second redistribution center pad region 30b is parallel to the second chip pad 50b and may include a flat top surface. As described in the discussion related to the first redistribution center pad region 30a, the top surface may have a first length a1 and the top surface of the second center region 42b may have a second length a2.

In example embodiments, the first length a1 may be greaterer than the second length a2. That is, an opening in the passivation film 80 may leave exposed the second redistribution center pad region 30b so that the first length a1 is larger than the second length a2.

In some example embodiments of the present disclosure, the second redistribution center pad region 30b may be a wire bonding region or a flip bonding region for packaging the semiconductor. Because the first length a1 is greater than the second length a2, the second redistribution center pad region 30b may secure a bonding region that allows more stable bonding, as compared to the second chip center pad region 40b. Because, in example embodiments in accordance with principles of inventive concepts, it is possible to stably maintain the electrical connection between the semiconductor device 1 and the outside using the larger surface area, or at least, longer bonding pad region of the second redistribution center pad region 30b, it is possible to improve the reliability of the semiconductor device 1 and the semiconductor package including the same.

The second redistribution layer 90b may include a second connection region 20b that is connected to the second redistribution center pad region 30b and is disposed between the passivation film 80 and the insulating film 70. The second connection region 20b may be disposed in the second redistribution region RA2. The second connection region 20b may electrically connect the second redistribution center pad region 30b and the second edge pad region 10b.

The second redistribution layer 90b may include a second edge pad region 10b with a top surface exposed to (that is, exposed through) the passivation film 80. The second edge pad region 10b may be disposed in the second edge region EA2.

The second edge pad region 10b may be a wire bonding region or a flip bonding region for packaging the semiconductor, for example. Unlike the illustrated configuration, an additional metal layer may be disposed on the second edge pad region 10b to form the wire bonding or the flip bonding.

Although the first and second redistribution layers 90a, 90b are illustrated as being symmetrically disposed in this embodiment, inventive concepts are not limited thereto. For example, only the first redistribution layer 90a may also be disposed on the semiconductor chip body 60. Additionally, although each of the first and second redistribution layers 90a, 90b is illustrated to include each of the first and second redistribution center pad regions 30a, 30b in this embodiment, inventive concepts are not limited thereto. Thus, the second redistribution layer 90b may not include the second redistribution center pad region 30b.

As described above, the first redistribution center pad region 30a is connected to the first chip center pad region 40a, and the second redistribution center pad region 30b is connected to the second chip center pad region 40b.

In particular, referring to FIG. 3 again, when the form of viewing each of the first redistribution center pad region 30a and the first chip center pad region 40a from the top surface is a rectangular form, the rectangular form may share a first side L1 each other. That is, in a region in which the first redistribution center pad region 30a and the first chip center pad region 40a abut against each other, the first redistribution center pad region 30a and the first chip center pad region 40a may have profiles continuously connected to each other.

Additionally, the first redistribution center pad region 30a may have a first width W1 along the second direction Y and a second width W2 along the first direction X, and the first chip center pad region 40a may have a first width W1 along the second direction Y and a third width W3 along the first direction X. Keeping in mind that the first chip center pad region 40a includes a first peripheral region 41a and a first center region 42a, the second width W2 may or may not be equal to or greater than the third width W3.

In the example embodiment of FIG. 3, the shapes of the first redistribution center pad region 30a and the first chip center pad region 40a are illustrated as an example on the assumption that the shape of the first chip pad 50a is rectangular. The shape of the first redistribution center pad region 30a and the shape of the first chip center pad region 40a are not limited to the illustrated shapes, and may be other polygonal shapes.

Although the shape of the second redistribution center pad region 30b and the shape of the second chip center pad region 40b are not illustrated in FIG. 3, the description of the first redistribution center pad region 30a and the first chip center pad region 40a may be similarly applied to the second redistribution center pad region 30b and the second chip center pad region 40b corresponding to each of the first redistribution center pad region 30a and the first chip center pad region 40a.

The semiconductor device 1 according to some example embodiments of inventive concepts has been described through FIGS. 1 through 3. Because the semiconductor device 1 according to this embodiment includes the first and second redistribution center pad regions 30a, 30b connected to the first and second chip center pad regions 40a, 40b, even in a case where the first and second redistribution layers 90a, 90b are disconnected due to an occurrence of defect such as short-circuit or open-curcuit in the first and second connection regions 20a, 20b, the first and second redistribution center pad regions 30a, 30b can be used as the bonding regions for packaging and bonding the semiconductor.

Furthermore, as described above, because the first and second redistribution center pad regions 30a, 30b include regions larger than first and second central regions 42a, 42b, it is possible to form and/or maintain the reliable packaging and bonding of the semiconductor. Inventive concepts are not limited to this example, and may also be similarly applied to some example embodiments of the present disclosure.

Next, a semiconductor device according to some example embodiments of the present disclosure will be described referring to FIGS. 4 and 5.

Figure 4:
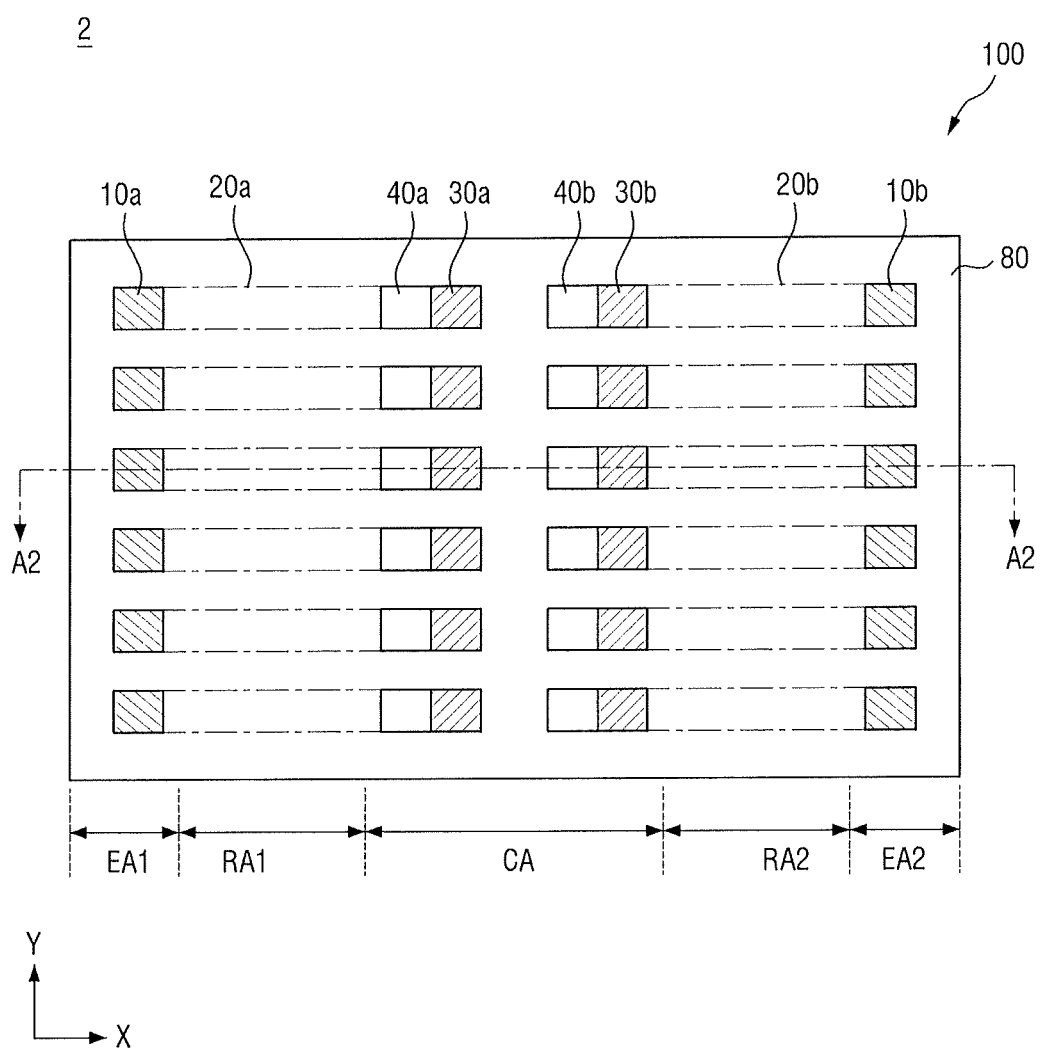
FIG. 4 is a perspective view for illustrating a semiconductor device according to some example embodiments of the inventive concepts.

FIG. 4 is a perspective view for illustrating a semiconductor device according to some example embodiments in accordance with principles of inventive concepts. FIG. 5 is a cross-sectional view taken along the line A2-A2 of FIG. 4.

The semiconductor device 2 according to this embodiment is substantially the same as the semiconductor device 1 as described through FIGS. 1 through 3 except that positions of the first chip center pad region of the first redistribution layer and the first redistribution center pad region are different.

Therefore, the same reference numerals refer to the same constituent elements, and a detailed description of the same constituent elements will not be repeated here.

Figure 5:
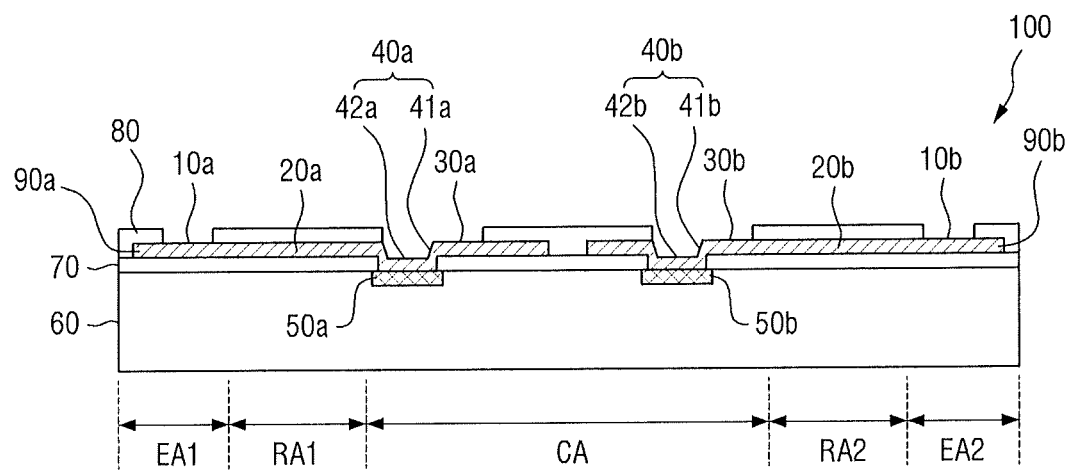
FIG. 5 is a cross-sectional view taken along the line A2-A2 of FIG. 4.

Referring to FIGS. 4 and 5, the semiconductor device 1 includes a semiconductor chip body 60, an insulating film 70, a passivation film 80, a first redistribution layer 90a and a second redistribution layer 90b.

The semiconductor chip body 60 may be divided into a first edge region EA1, a first redistribution region RA1, a central region CA, a second redistribution region RA2 and a second edge region EA2. The first redistribution layer 90a may include a first chip center pad region 40a, a first redistribution center pad region 30a, a first connection region 20a and a first edge pad region 10a. The second redistribution layer 90b may include a second chip center pad region 40b, a second redistribution center pad region 30b, a second connection region 20b and a second edge pad region 10b.

In this example embodiment, the first chip center pad region 40a of the first redistribution layer 90a may be disposed between the first redistribution center pad region 30a and the first connection region 20a and, as a result, in the semiconductor device 2 according to the example embodiment, the distance between the first redistribution center pad region 30a and the second redistribution center pad region 30b may be relatively short, as compared to the semiconductor device 1 as described through FIGS. 1 through 3.

In example embodiments of a semiconductor device in accordance with principles of inventive concepts, by variously modifying the arrangement between the first redistribution center pad region 30a and the first chip center pad region 40a and/or the arrangement between the second redistribution center pad region 30b and the second chip center pad region 40b, it is possible to variously modify the distance between the first redistribution center pad region 30a and the second redistribution center pad region 30b.

Example embodiments of a semiconductor device in accordance with principles of inventive concepts will be described referring to FIGS. 6 and 7.

Figure 6:
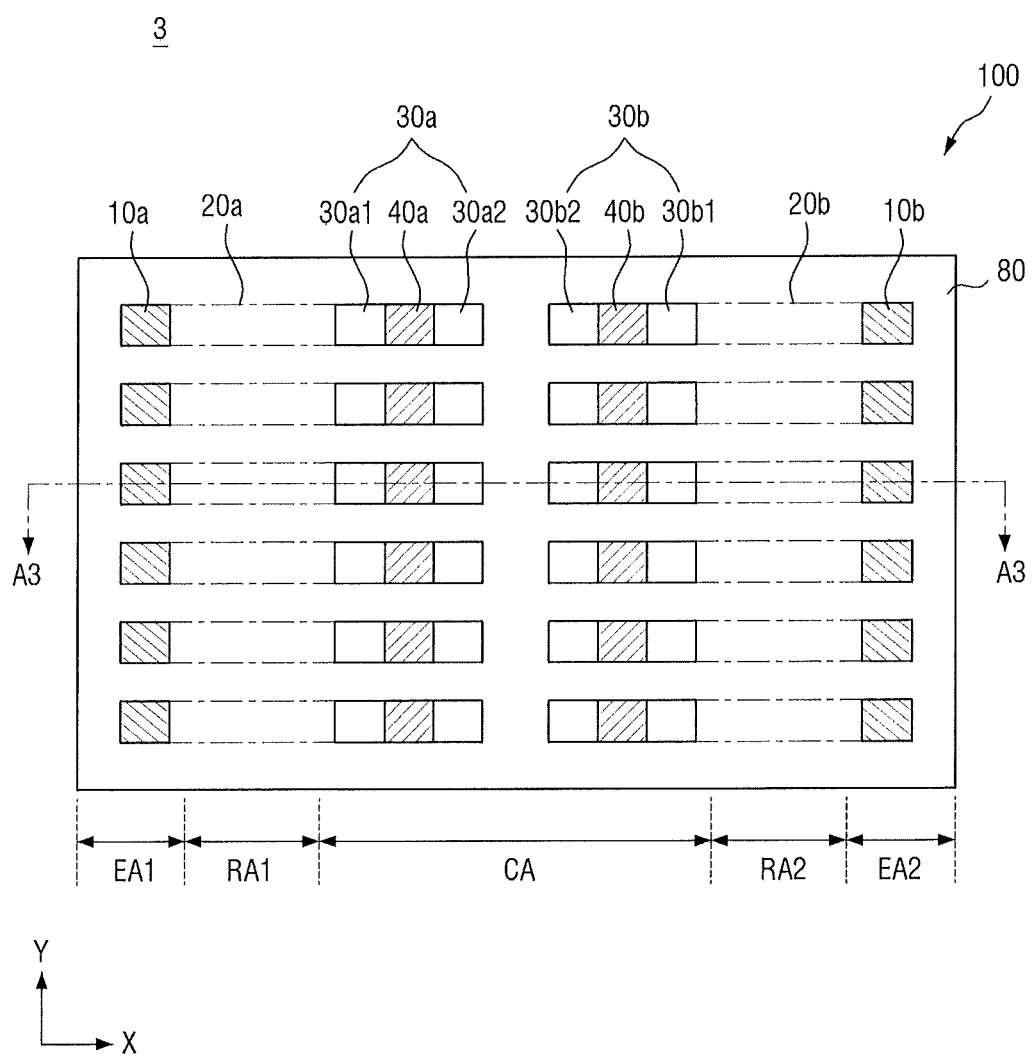
FIG. 6 is a perspective view for illustrating a semiconductor device according to some example embodiments of the present invention.

FIG. 6 is a perspective view for illustrating example embodiments of a semiconductor device in accordance with principles of inventive concepts. FIG. 7 is a cross-sectional view taken along the line A3-A3 of FIG. 6.

The semiconductor device according to this embodiment is substantially the same as the semiconductor device described through FIGS. 1 through 3, except that each of the first and second redistribution layers includes a plurality of redistribution center pad regions.

The same reference numerals refer to the same constituent elements, and a detailed description of the same constituent elements will not be repeated here.

Figure 7:
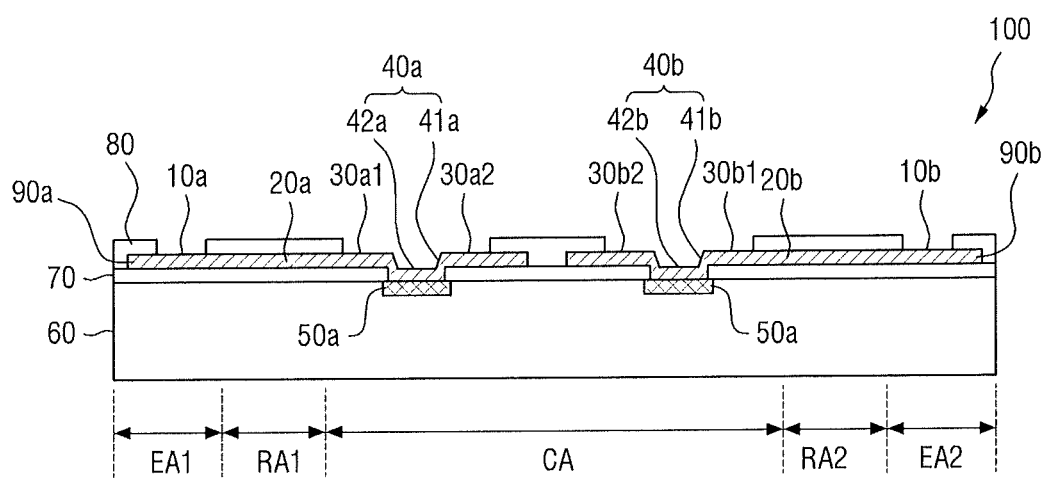
FIG. 7 is a cross-sectional view taken along the line A3-A3 of FIG. 6.

Referring to FIGS. 6 and 7, the semiconductor device 3 includes a semiconductor chip body 60, an insulating film 70, a passivation film 80, a first redistribution layer 90a and a second redistribution layer 90b.

The semiconductor chip body 60 may be divided into a first edge region EA1, a first redistribution region RA1, a central region CA, a second redistribution region RA2 and a second edge region EA2. The first redistribution layer 90a may include a first chip center pad region 40a, a first redistribution center pad region 30a, a first connection region 20a and a first edge pad region 10a, and the second redistribution layer 90b may include a second chip center pad region 40b, a second redistribution center pad region 30b, a second connection region 20b and a second edge pad region 10b.

The first redistribution center pad region 30a may include a first sub-center pad region 30a1 and a second sub-center pad region 30a2, and the second redistribution center pad region 30b may include a third sub-center pad region 30b1 and a fourth sub-center pad region 30ab2.

The first sub-center pad region 30a1 and the second sub-center pad region 30a2 may be disposed side by side in the first direction X around the first chip center pad region 40a.

The third sub-center pad region 30b1 and the fourth sub-center pad region 30b2 may be disposed side by side in the first direction X around the second chip center pad region 40b.

The first sub-center pad region 30a1 and the second sub-center pad region 30a2 may be a region that is continuous with the first chip center pad region 40a. The third sub-center pad region 30b1 and the fourth sub-center pad region 30b2 may be regions which are continuous with the second chip center pad region 40b.

In this example embodiment, each of the first sub-center pad region 30a1 and the second sub-center pad region 30a2 included in the first redistribution center pad region 30a may be substantially the same as the first redistribution center pad region 30a described through FIGS. 1 through 3. That is, each of the first redistribution layer 90a and the second redistribution layer 90b is substantially the same as those including a plurality of first and second redistribution center pad regions 30a, 30b of FIGS. 1 through 3.

In this example embodiment, the first redistribution center pad region 30a includes the first sub-center pad region 30a1 and the second sub-center pad region 30a2, and the second redistribution center pad region 30b includes the third sub-center pad region 30b1 and the fourth sub-center pad region 30ab2, and it is possible to broadly ensure an effective wire bonding region or the flip bonding region for packaging and bonding the semiconductor.

Therefore, the reliability of a semiconductor package including the semiconductor device 3 according to this embodiment can be improved. In particular, as will be described in greater detail below, in the case of the semiconductor package subjected to flip bonding, it is possible to further improve the reliability as compared to other types of semiconductor packages.

An example embodiment of a semiconductor device according to inventive concepts will be described referring to FIGS. 8 to 10.

Figure 8:
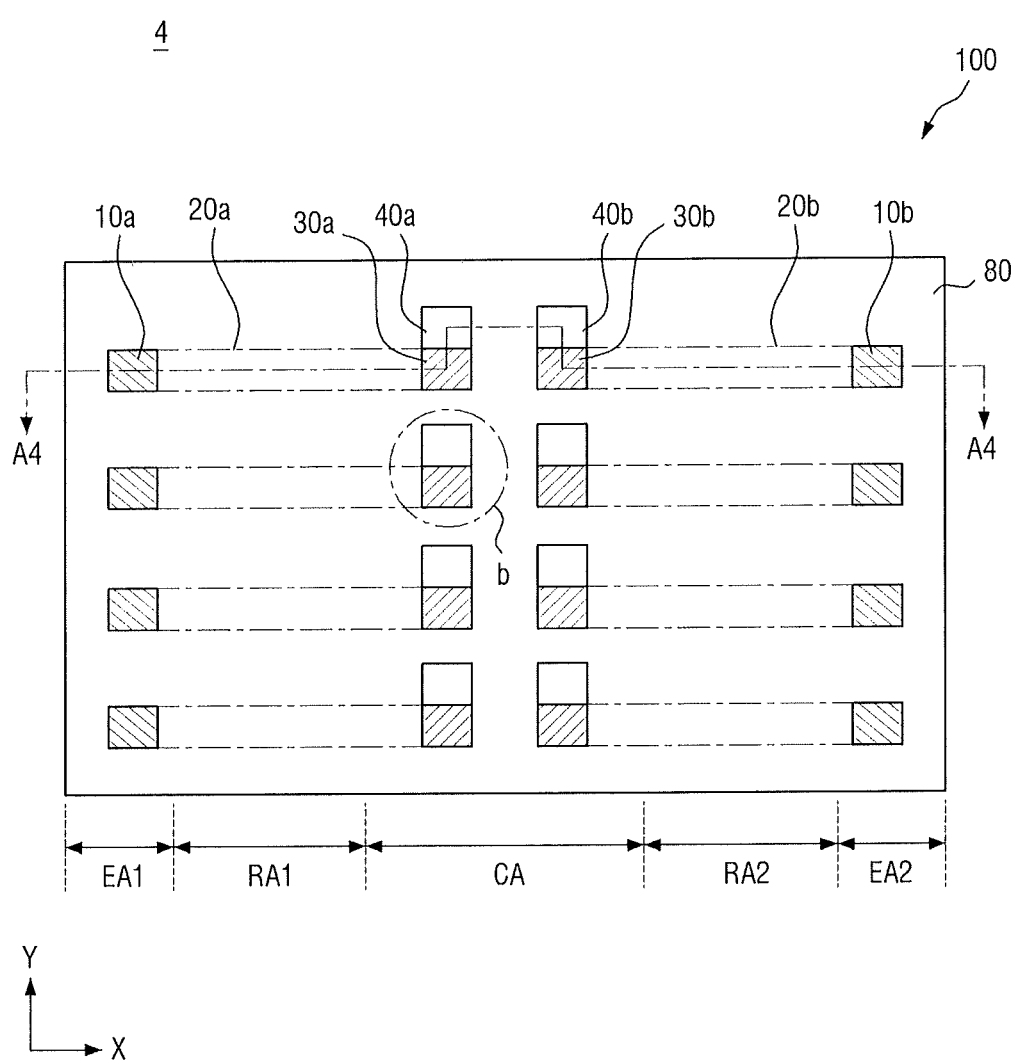
FIG. 8 is a perspective view for illustrating the semiconductor device according to some example embodiments of the present invention.

FIG. 8 is a perspective view for illustrating the semiconductor device according to some example embodiments of the present disclosure. FIG. 9 is a cross-sectional view taken along the line A4-A4 of FIG. 8. FIG. 10 is an enlarged perspective view of a dotted region 'b' of FIG. 8.

The semiconductor device according to this example embodiment is substantially the same as the semiconductor device described through FIGS. 1 to 3, except that the first and second chip center pad regions and the first and second redistribution center pad regions included in each of the first and second redistribution layers are arranged along the second direction.

The same reference numerals refer to the same constituent elements, and a detailed description of the same constituent elements will not be repeated here.

Figure 9:
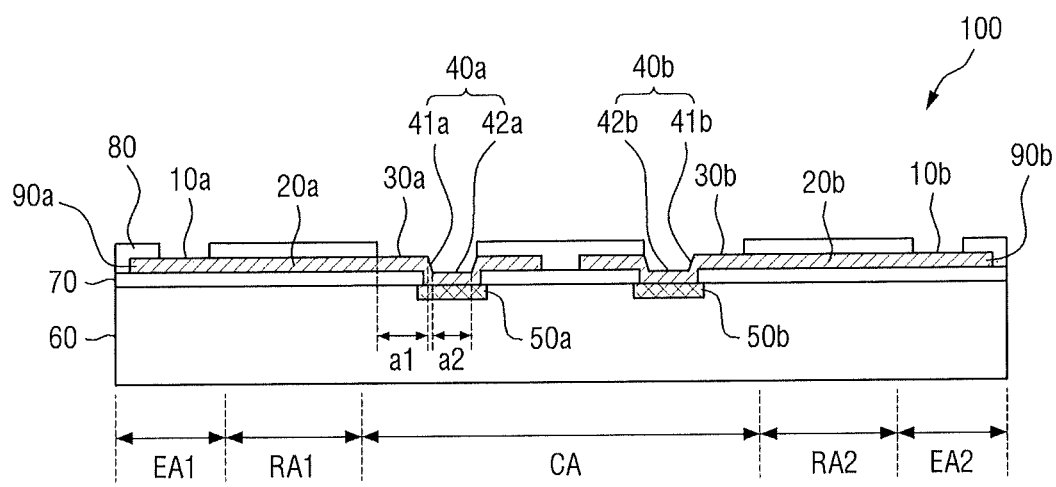
FIG. 9 is a cross-sectional view taken along the line A4-A4 of FIG. 8.
Figure 10:
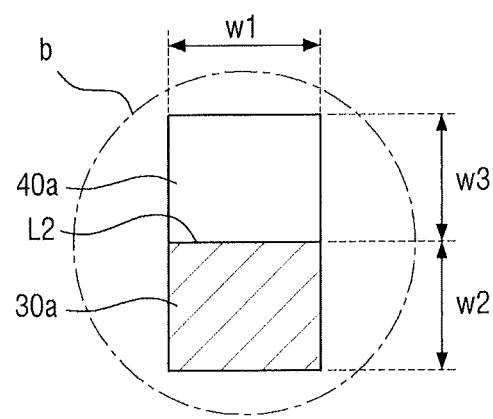
FIG. 10 is an enlarged perspective view of a dotted region 'b' of FIG. 8.

Referring to FIGS. 8 to 10, a semiconductor device 4 includes a semiconductor chip body 60, an insulating film 70, a passivation film 80, a first redistribution layer 90a and a second redistribution layer 90b.

The semiconductor chip body 60 may be divided into a first edge region EA1, a first redistribution region RA1, a central region CA, a second redistribution region RA2 and a second edge region EA2. The first redistribution layer 90a may include a first chip center pad region 40a, a first redistribution center pad region 30a, a first connection region 20a and a first edge pad region 10a, and the second redistribution layer 90b may include a second chip center pad region 40b, a second redistribution center pad region 30b, a second connection region 20b and a second edge pad region 10b.

In this example embodiment, the first redistribution layer 90a may include a first connection region 20a and a first edge pad region 10a arranged along the first direction X, and a first chip center pad region 40a disposed along the second direction Y, around the first redistribution center pad region 30a.

Second redistribution layer 90b may include a second connection region 20b and a second edge pad region 10b arranged along the first direction X, and a second chip center pad region 40b disposed along the second direction Y, around the second redistribution center pad region 30b.

In this example embodiment, the first and second chip center pad regions 40a, 40b, the first and second redistribution center pad regions 30a, 30b, the first and second connection regions 20a, 20b and the first and second edge pad regions 10a, 10b included in each of the first and second redistribution layers 90a, 90b may be irregularly disposed in a direction different from the first direction X, rather than being disposed along the first direction X as in some example embodiments.

That is, in this example embodiment, the arrangement of the first and second chip center pad regions 40a, 40b and the first and second redistribution center pad regions 30a, 30b included in the first and second redistribution layers 90a, 90b described through FIG. 8 describes an example in which various arrangements of a plurality of regions included in each of the first and second redistribution layers 90a, 90b are possible.

In particular, referring to FIG. 10 again, the first chip center pad region 40a and the first redistribution center pad region 30a included in the first redistribution layer 90a are continuously disposed along the second direction Y and each are in the rectangular forms that share a second side L2.

Example embodiments of a semiconductor device in accordance with principles of inventive concepts will be described referring to FIGS. 11 and 12.

Figure 11:
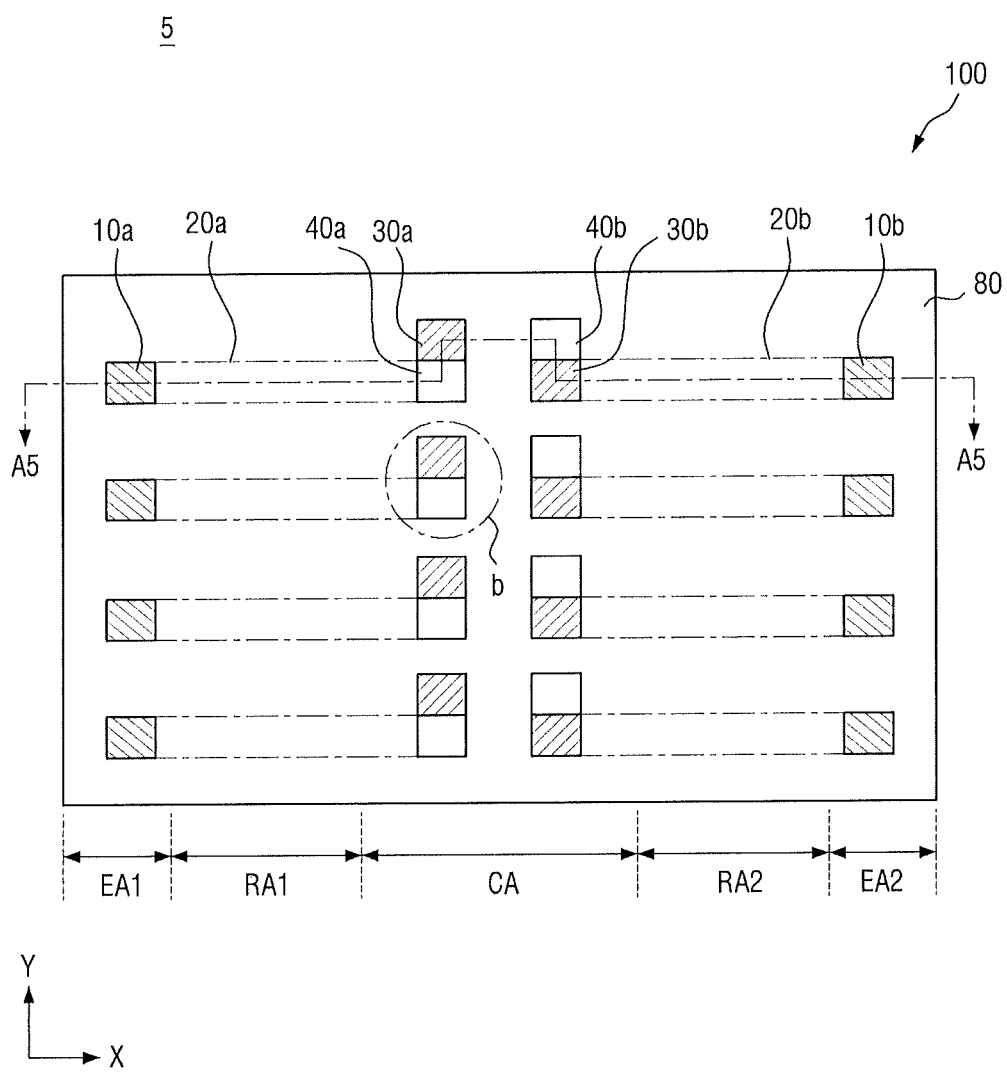
FIG. 11 is a perspective view for illustrating a semiconductor device according to some example embodiments of the present invention.
Figure 12:
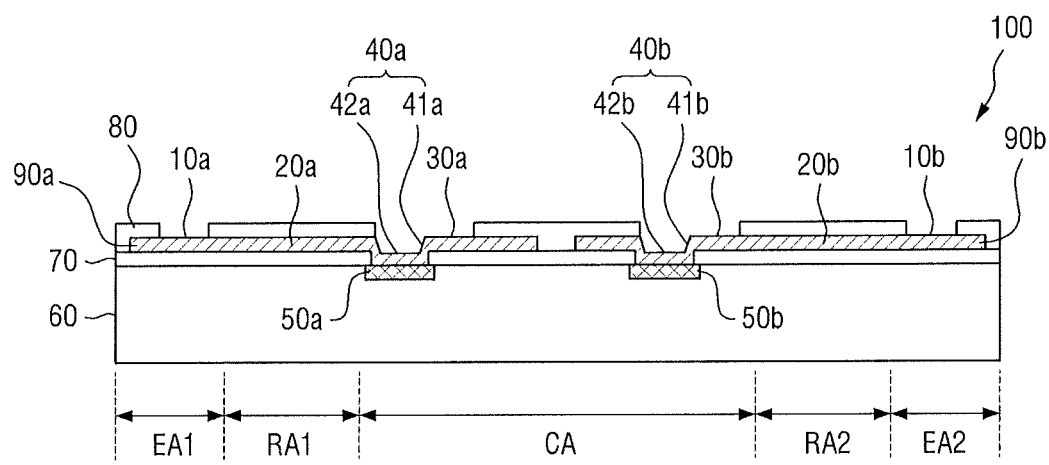
FIG. 12 is a cross-sectional view taken along the line A5-A5 of FIG. 11.

FIG. 11 is a perspective view for illustrating a semiconductor device according to some example embodiments and FIG. 12 is a cross-sectional view taken along the line A5-A5 of FIG. 11.

A semiconductor device according to this example embodiment is substantially the same as the semiconductor device described through FIGS. 8 to 10, except that the arrangement of the first chip center pad region and the first redistribution center pad region is different.

The same reference numerals refer to the same constituent elements, and a detailed description of the same constituent elements will not be repeated here.

Referring to FIGS. 11 and 12, a semiconductor device 5 includes a semiconductor chip body 60, an insulating film 70, a passivation film 80, a first redistribution layer 90a and a second redistribution layer 90b.

The semiconductor chip body 60 may be divided into a first edge region EA1, a first redistribution region RA1, a central region CA, a second redistribution region RA2 and a second edge region EA2. The first redistribution layer 90a may include a first chip center pad region 40a, a first redistribution center pad region 30a, a first connection region 20a and a first edge pad region 10a. The second redistribution layer 90b may include a second chip center pad region 40b, a second redistribution center pad region 30b, a second connection region 20b and a second edge pad region 10b.

In this example embodiment, the first redistribution layer 90a may include a first connection region 20a and a first edge pad region 10a disposed along the first direction X, and a first redistribution center pad region 30a disposed along the second direction Y, around the first chip center pad region 40a.

The second redistribution layer 90b may include a second connection region 20b and a second edge pad region 10b disposed along the first direction X, and a second chip center pad region 40b disposed along the second direction Y, around the second redistribution center pad region 30b.

As illustrated in this example embodiment, the first and second chip center pad regions 40a, 40b, the first and second redistribution center pad regions 30a, 30b, the first and second connection regions 20a, 20b and the first and second edge pad regions 10a, 10b included in each of the first and second redistribution layers 90a, 90b can be variously disposed.

An example embodiment of a semiconductor device in accordance with principles of inventive concepts will be described referring to FIGS. 13 and 14.

Figure 13:
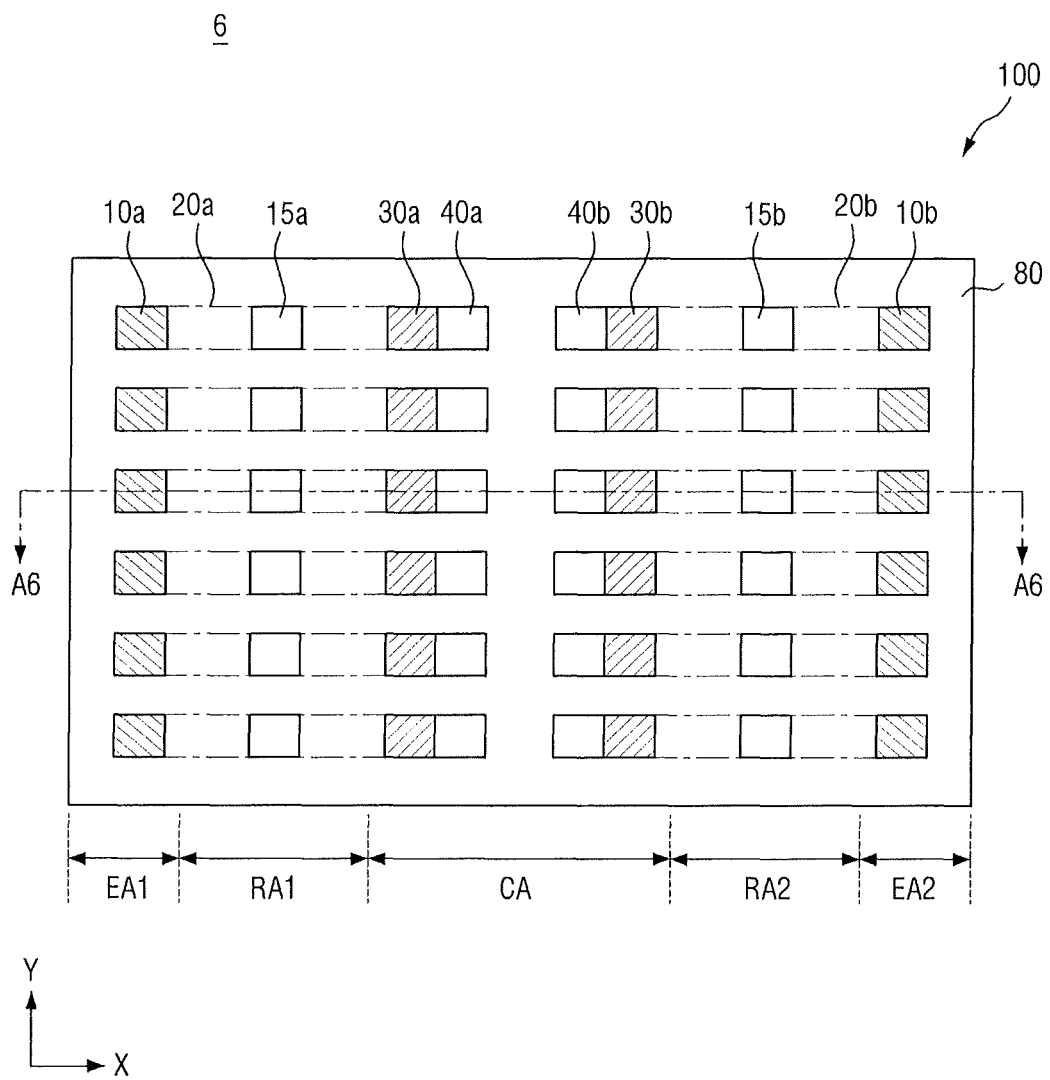
FIG. 13 is a perspective view for illustrating a semiconductor device according to some example embodiments of the present invention.
Figure 14:
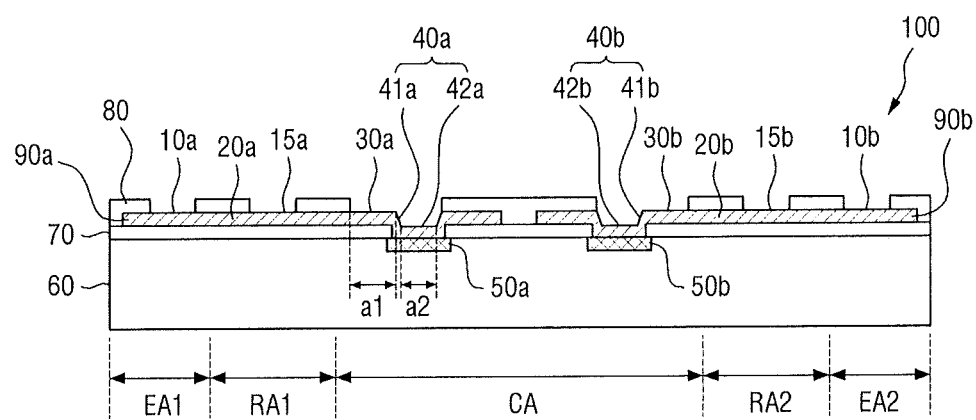
FIG. 14 is a cross-sectional view taken along the line A6-A6 of FIG. 13.

FIG. 13 is a perspective view for illustrating example embodiments of a semiconductor device in accordance with principles of inventive concepts and FIG. 14 is a cross-sectional view taken along the line A6-A6 of FIG. 13.

A semiconductor device 6 according to this example embodiment is substantially the same as the semiconductor device 1 as described through FIGS. 1 to 3.

The same reference numerals refer to same constituent elements, and a detailed description of the same constituent elements will not be repeated here.

Referring to FIGS. 13 and 14, the semiconductor device 6 includes a semiconductor chip body 60, an insulating film 70, a passivation film 80, a first redistribution layer 90a and a second redistribution layer 90b.

The semiconductor chip body 60 may be divided into a first edge region EA1, a first redistribution region RA1, a central region CA, a second redistribution region RA2 and a second edge region EA2. The first redistribution layer 90a may include a first chip center pad region 40a, a first redistribution center pad region 30a, a first connection region 20a, a first connection pad region 15a and a first edge pad region 10a. The second redistribution layer 90b may include a second chip center pad region 40b, a second redistribution center pad region 30b, a second connection region 20b, a second connection pad region 15b and a second edge pad region 10b.

In this example embodiment, the semiconductor device 6 includes a first connection pad region 15a disposed in the first redistribution region RA1, and a second connection pad region 15b disposed in the second redistribution region RA2.

Through the first and second connection pad regions 15a, 15b disposed in the first and second redistribution regions RA1, RA2, it is possible to check an occurrence point of defect such as short- or open-circuit in the first and second redistribution layers 90a, 90b. Thus, it is possible to determine whether to use the semiconductor device 6, and it is possible to perform process improvement work for preventing an occurrence of the same defect in other semiconductor devices.

In this example embodiment, although the single first and second connection pad regions 15a, 15b are illustrated as being disposed in each of the first and second redistribution regions RA1, RA2, inventive concepts are not limited thereto. For example, the plurality of first and second connection pad regions 15a, 15b may be disposed in each of the first and second redistribution regions RA1, RA2.

The number of first and second connection pad regions 15a, 15b disposed in each of the first and second redistribution regions RA1, RA2 may be selected in view of the area of the region exposed through the first and second connection pad regions 15a, 15b.

Further, respective areas of the first and second connection pad regions 15a, 15b may be relatively smaller than the area of the first and second chip center pad regions 40a, 40b and/or the first and second redistribution center pad regions 30a, 30b, for example, but inventive concepts are not limited thereto.

Example embodiments of a semiconductor package in accordance with principles of inventive concepts will be described referring to FIGS. 15 and 16.

Figure 15:
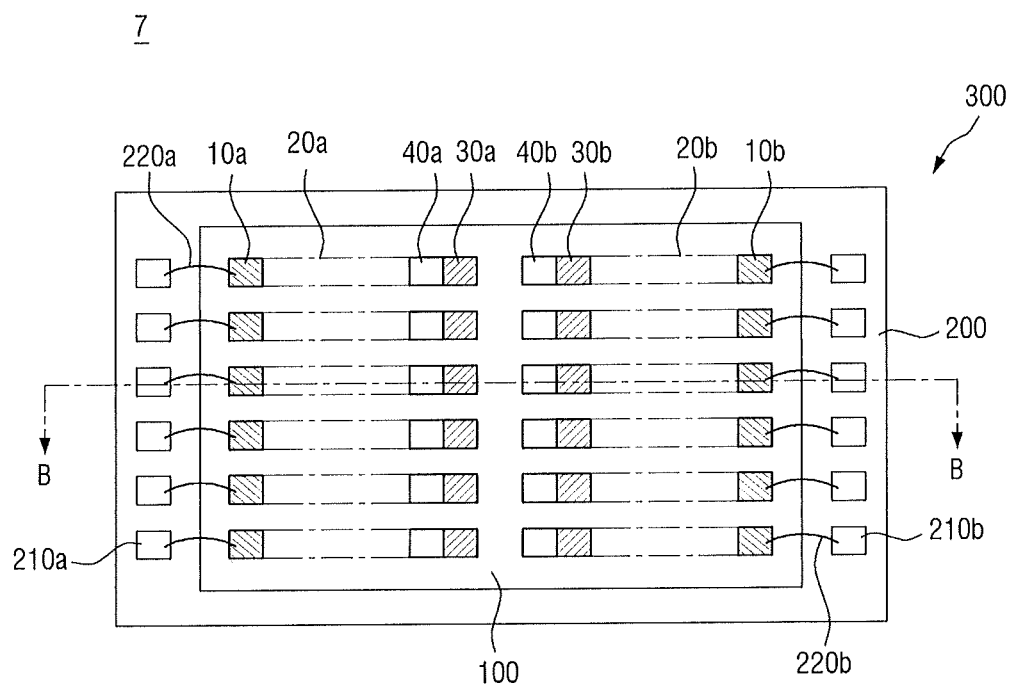
FIG. 15 is a perspective view for illustrating the semiconductor package according to some example embodiments of the present invention.
Figure 16:
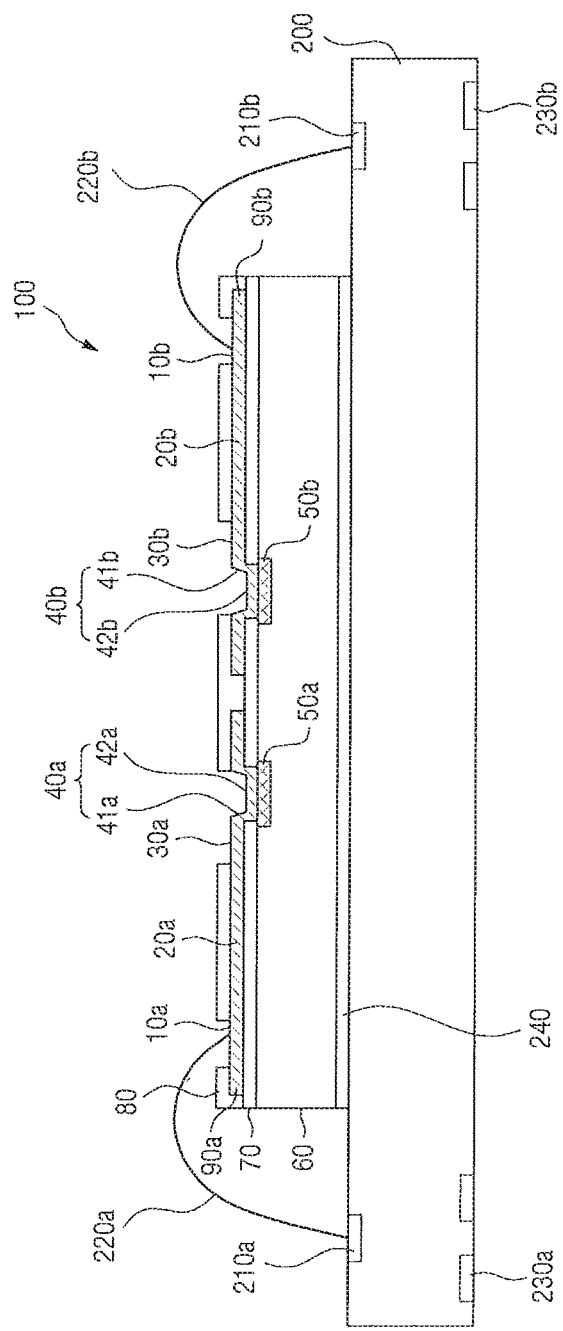
FIG. 16 is a cross-sectional view taken along the line B-B of FIG. 15.

FIG. 15 is a perspective view for illustrating example embodiments of a semiconductor package in accordance with principles of inventive concepts and FIG. 16 is a cross-sectional view taken along the line B-B of FIG. 15.

In this example embodiment, the semiconductor chip 100 included in the semiconductor package 7 may be any one of the semiconductor devices 1 to 6 described above. The same reference numerals of the semiconductor chip 100 refer to same constituent elements, and a detailed description of the same constituent elements will not be repeated here. Referring to FIGS. 15 and 16, the semiconductor package 7 includes a semiconductor chip 100, a package substrate 200, first and second wires 220a, 220b and an adhesive layer 240.

The semiconductor chip 100 includes a semiconductor chip body 60, an insulating film 70, a passivation film 80, a first redistribution layer 90a and a second redistribution layer 90b. The first redistribution layer 90a may include a first chip center pad region 40a, a first redistribution center pad region 30a, a first connection region 20a and a first edge pad region 10a. The second redistribution layer 90b may include a second chip center pad region 40b, a second redistribution center pad region 30b, a second connection region 20b and a second edge pad region 10b.

The semiconductor chip 100 may be disposed on a package substrate 200 through the adhesive layer 240. The adhesive layer 240 may include resin or the like, but inventive concepts are not limited thereto.

The package substrate 200 may include first and second top pads 210a, 201b and first and second bottom pads 230a, 230b. The package substrate 200 may be, for example, a printed circuit board (PCB). In this example embodiment, the package substrate 200 may be a ball grid array (BGA) type package substrate. The package substrate 200 may include internal wirings. The first and second top pads 210a, 201b may be connected to the internal wirings disposed in the package substrate 200.

Each of the first and second top pads 210a, 201b may be a region in which the first and second wires 220a, 220b are bonded.

The first and second wires 220a, 220b may electrically connect with the semiconductor chip 100 with the package substrate 200. Specifically, the first wire 220a may electrically connect the first top pad 210a with the first edge pad region 10a to transmit and receive electrical signals. The second wire 210b may electrically connect the second top pad 210b with the second edge pad region 10b to transmit and receive the electrical signals.

The electrical signals transmitted and received through the respective first and second wires 220a, 220b may be signals different from each other. Solder balls may be disposed on the first and second bottom pads 230a, 230b, and the semiconductor package 7 may be mounted on a substrate of an electronic device.

Example embodiments of a semiconductor package according to principles of inventive concepts will be described referring to FIG. 17.

Figure 17:
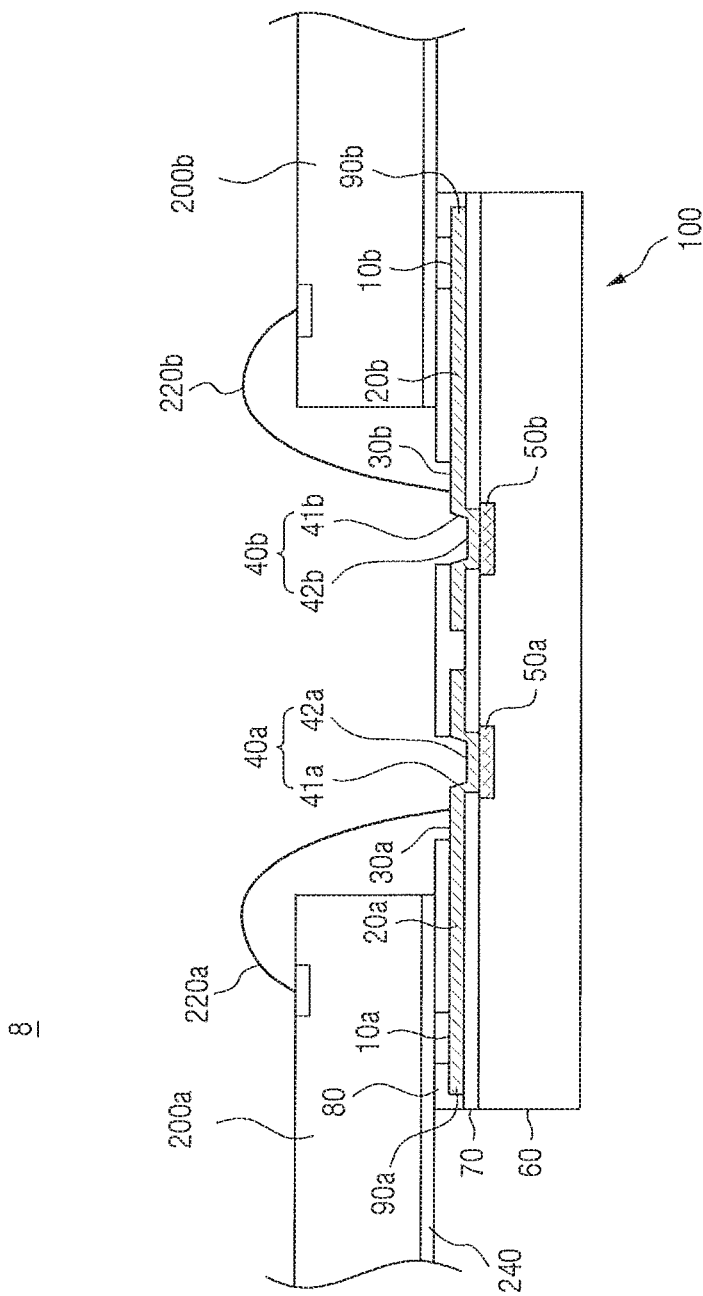
FIG. 17 is a cross-sectional view for illustrating the semiconductor package according to some example embodiments of the present invention.

FIG. 17 is a cross-sectional view for illustrating example embodiments of a semiconductor package in accordance with principles of inventive concepts.

A semiconductor package 8 according to this embodiment is substantially the same as the semiconductor package 7 described through FIGS. 15 and 16, except for the packaging type. The same reference numerals refer to same constituent elements, and a detailed description of the same constituent elements will not be repeated here.

In the semiconductor package 8 according to this example embodiment, a semiconductor chip 100 is a board on chip (BOC) type and may be disposed on the package substrates 200a, 200b.

Referring to FIG. 17, the semiconductor package 8 includes a semiconductor chip 100, a package substrate 200, first and second wires 220a, 220b and an adhesive layer 240.

The semiconductor chip 100 includes a semiconductor chip body 60, an insulating film 70, a passivation film 80, a first redistribution layer 90a and a second redistribution layer 90b. The first redistribution layer 90a may include a first chip center pad region 40a, a first redistribution center pad region 30a, a first connection region 20a and a first edge pad region 10a. The second redistribution layer 90b may include a second chip center pad region 40b, a second redistribution center pad region 30b, a second connection region 20b and a second edge pad region 10b.

The semiconductor chip 100 may be disposed on the package substrates 200a, 200b through the adhesive layer 240. The adhesive layer 240 may include resin or the like, but inventive concepts are not limited thereto.

The package substrates 200a, 200b may include first and second top pads 210a, 201b. The package substrates 200a, 200b, for example, may be a printed circuit board (PCB). The package substrates 200a, 200b may include internal wirings. The first and second top pads 210a, 201b may be connected to the internal wirings disposed in the package substrates 200a, 200b.

Each of the first and second top pads 210a, 201b may be a region in which the first and second wires 220a, 220b are bonded.

The first and second wires 220a, 220b may electrically connect the semiconductor chip 100 with the package substrates 200a, 200b. The first and second wires 220a, 220b, for example, may be formed of a conductive material containing copper.

The first wire 220a may electrically connect the first top pad 210a with the first redistribution center pad region 30a to transmit and receive the electrical signals. The second wire 210b may electrically connect the second top pad 210b with the second redistribution center pad region 30b to transmit and receive the electrical signals. The electrical signals transmitted and received through the first and second wires 220a, 220b may be signals different from each other.

In this example embodiment, the first and second wires 220a, 220b may be bonded to the first and second redistribution center pad regions 30a, 30b to transmit and receive the electrical signals to and from the package substrates 200a, 200b.

That is, the semiconductor package 8 according to this example embodiment may not use the first and second edge pad regions 10a, 10b. For example, when defect such as short-circuit of the first and second redistribution layers 90a, 90b occurs in the first and second connection regions 20a, 20b, the semiconductor chip 100 may be used through the first and second redistribution center pad regions 30a, 30b. In accordance with principles of inventive concepts, it is possible to utilize semiconductor chip 100 that otherwise may have been discarded due to the defect of the first and second redistribution layers 90a, 90b, and the semiconductor package including the same.

Example embodiments of a semiconductor package according to inventive concepts will be described referring to FIGS. 18 and 19.

Figure 18:
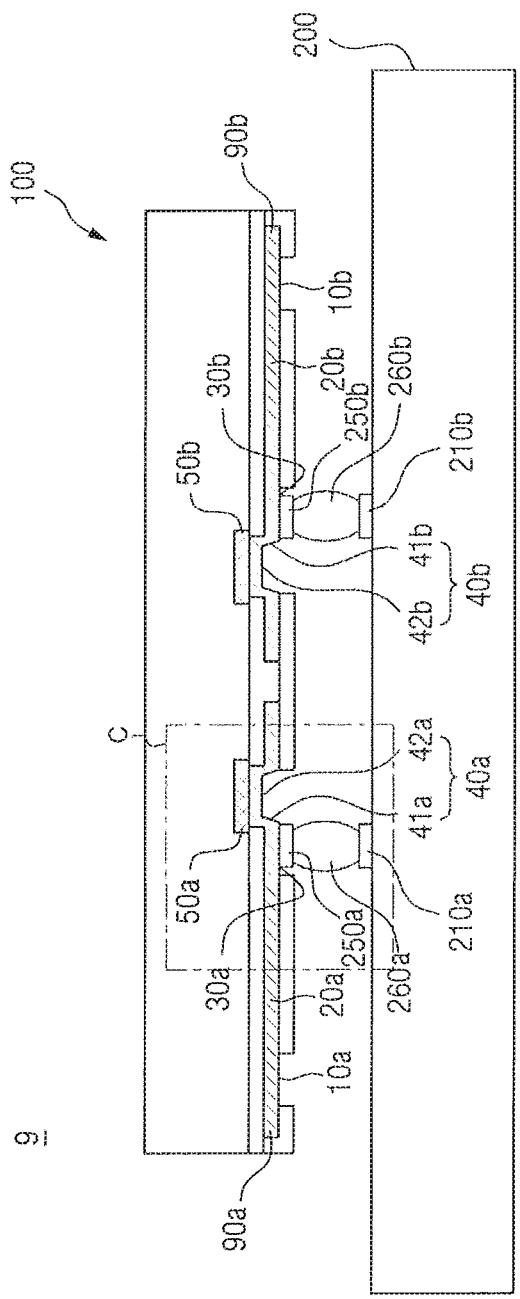
FIG. 18 is a cross-sectional view for illustrating the semiconductor package according to some example embodiments of the present invention.
Figure 19:
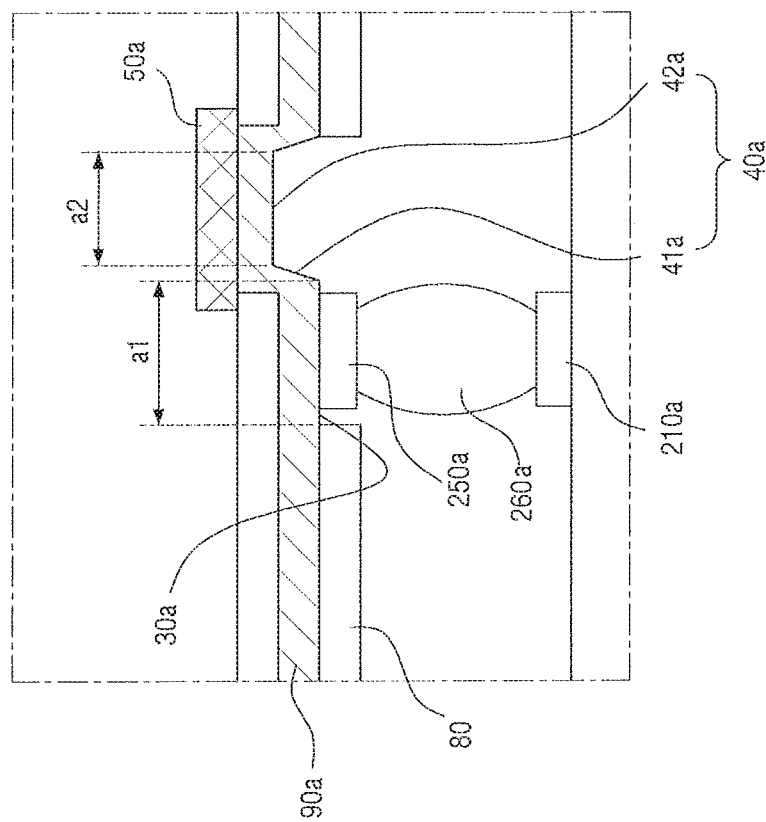
FIG. 19 is an enlarged cross-sectional view of a dotted region 'c' of FIG. 18.

FIG. 18 is a cross-sectional view for illustrating example embodiments of a semiconductor package in accordance with principles of inventive concepts and FIG. 19 is an enlarged cross-sectional view of a dotted region 'c' of FIG. 18.

A semiconductor package 9 according to this embodiment is substantially the same as the semiconductor package 7 described through FIGS. 15 and 16, except for the package type. The same reference numerals refer to same constituent elements, and a detailed description of the same constituent elements will not be repeated here.

In the semiconductor package 9 according to this embodiment, the semiconductor chip 100 may be disposed on the package substrate 200 in a flip type.

Referring to FIGS. 18 and 19, the semiconductor package 9 includes a semiconductor chip 100, a package substrate 200, first and second flip pads 250a, 250b and first and second bumps 260a, 260b.

The semiconductor chip 100 includes a semiconductor chip body 60, an insulating film 70, a passivation film 80, a first redistribution layer 90a and a second redistribution layer 90b. The first redistribution layer 90a may include a first chip center pad region 40a, a first redistribution center pad region 30a, a first connection region 20a and a first edge pad region 10a. The second redistribution layer 90b may include a second chip center pad region 40b, a second redistribution center pad region 30b, a second connection region 20b and a second edge pad region 10b.

The first and second flip pads 250a, 250b, for example, may contain aluminum, and the first and second bumps 260a, 260b may be formed in a multilayer structure that contains a conductive material.

The package substrate 200 may include first and second top pads 210a, 201b. The first and second top pads 210a, 201b, for example, may contain aluminum. The package substrate 200 may be, for example, a printed circuit board (PCB). The package substrate 200 may include internal wirings. The first and second top pads 210a, 201b may be connected to the internal wirings disposed in the package substrate 200.

Each of the first and second top pads 210a, 201b may be a region in which the first and second bumps 260a, 260b are bonded.

The first and second bumps 260a, 260b may electrically connect the semiconductor chip 100 with the package substrate 200. Specifically, the first bumps 260a may electrically connect the first top pad 210a with the first redistribution center pad region 30a to transmit and receive electrical signals. The second bump 260b may electrically connect the second top pad 210b with the second redistribution center pad region 30b to transmit and receive electrical signals. Electrical signals transmitted and received through each of the first and second bumps 260a, 260b may be signals different from each other.

In this example embodiment, the first and second bumps 260a, 260b may be bonded to the first and second redistribution center pad regions 30a, 30b to transmit and receive electrical signals to and from the package substrates 200a, 200b.

FIG. 19 illustrates that the first flip pad 250a is disposed on the first redistribution center pad region 30a. As described above, the length a1 of the first redistribution center pad region 30a is greater than the length a2 of the first bonding region 41a of the first chip center pad region 40a. Therefore, the first flip pad 250a may be disposed on a wider region of the first redistribution center pad region 30a. In accordance with principles of inventive concepts, the semiconductor package 9 according to the embodiment is capable of performing reliable flip bonding.

Further, the semiconductor package 9 according to this embodiment also may notuse the first and second edge pad regions 10a, 10b. Thus, when a defect such as short- or open-circuit of the first and second redistribution layers 90a, 90b occurs in the first and second connection regions 20a, 20b, the semiconductor chip 100 may be used through the first and second redistribution center pad regions 30a, 30b. Therefore, it is possible to utilize a semiconductor chip 100 that may otherwise have been discarded due to the defect of the first and second redistribution layers 90a, 90b, and the semiconductor package including the same.

Example embodiments of a semiconductor package in accordance with principles of inventive concepts will be described referring to FIG. 20.

Figure 20:
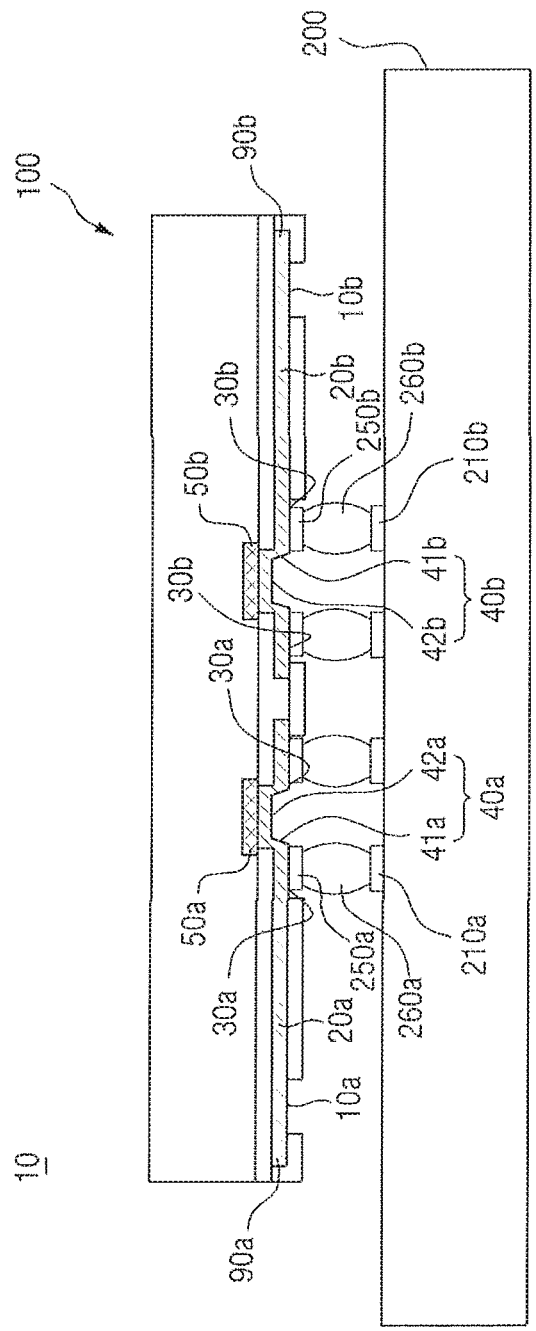
FIG. 20 is a cross-sectional view for illustrating the semiconductor package according to some example embodiments of the present invention.

FIG. 20 is a cross-sectional view for illustrating example embodiments of a semiconductor package in accordance with principles of inventive concepts.

The semiconductor package 10 according to this embodiment is substantially the same as the semiconductor package 9 described through FIGS. 18 and 19, except for a difference in the number of bumps.

Also, the semiconductor chip 100 included in the semiconductor package 10 according to this embodiment may be substantially the same as the semiconductor chip 100 disclosed in the semiconductor device 3 described through FIGS. 6 and 7. The same reference numerals refer to the same constituent elements, and a detailed description of the same constituent elements will not be repeated here.

Referring to FIG. 20, the semiconductor package 10 includes a semiconductor chip 100, a package substrate 200, a plurality of first and second flip pads 250a, 250b and a plurality first and second bumps 260a, 260b.

The semiconductor chip 100 includes a semiconductor chip body 60, an insulating film 70, a passivation film 80, a first redistribution layer 90a and a second redistribution layer 90b. The first redistribution layer 90a may include a first chip center pad region 40a, a plurality of first redistribution center pad regions 30a, a first connection region 20a and a first edge pad region 10a, and the second redistribution layer 90b may include a second chip center pad region 40b, a plurality of second redistribution center pad regions 30b, a second connection region 20b and a second edge pad region 10b.

The plurality of first and second flip pads 250a, 250b, for example, may contain aluminum, and the first and second bumps 260a, 260b may be formed of a multilayer structure that contains a conductive material.

The package substrate 200 may include a plurality of first and second top pads 210a, 201b. The first and second top pads 210a, 201b, for example, may contain aluminum. The package substrate 200, for example, may be a printed circuit board (PCB). The package substrate 200 may include internal wirings. The first and second top pads 210a, 201b may be connected to the internal wirings disposed in the package substrate 200.

Each of the plurality of first and second top pads 210a, 210b may be a region in which the plurality of first and second bumps 260a, 260b is bonded.

The plurality of first and second bumps 260a, 260b may electrically connect the semiconductor chip 100 with the package substrate 200. In this embodiment, the plurality of first bumps 260a may be electrically connected to the first chip pad 50a, and the plurality of second bumps 260b may be electrically connected to the second chip pad 50b.

Therefore, even when a defect occurs in any one of the plurality of first bumps 260a, it is possible to maintain the electrical connection with the first chip pad 50a using the other first bump 260a, and similarly, when a defect occurs in any one of the plurality of second bumps 260b, it is possible to maintain the electrical connection with the second chip pad 50b using the other second bump 260b.

Thus, the semiconductor package 10 according to inventive concepts may improve the reliability of the semiconductor package 10 packaged in a flip type.

Figure 21:
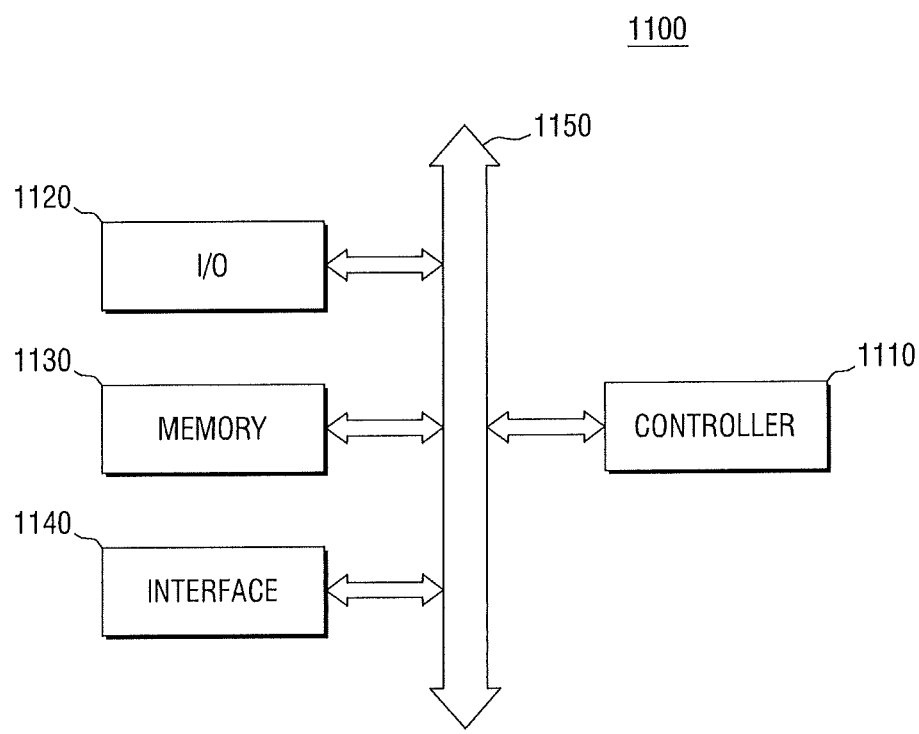
FIG. 21 is a block diagram of an electronic system including the semiconductor device and the semiconductor package according to some example embodiments of the present invention.

FIG. 21 is a block diagram of an electronic system including a semiconductor device and semiconductor package in accordance with principles of inventive concepts.

Referring to FIG. 21, the electronic system 11000 including the semiconductor device 1 to 6 and the semiconductor package 7 to 10 according to some example embodiments of inventive concepts may include a controller 11100, an input/ output (I/O) device 11200, a memory device 11300, an interface 11400 and a bus 11500. The controller 11100, the I/O device 11200, the memory device 11300 and/or the interface 11400 may be connected to one another through the bus 11500. The bus 11500 corresponds to a path through which the data are moved.

The controller 11100 may include at least one of a microprocessor, a digital signal processor, a microcontroller and logic devices capable of performing similar functions to the elements. The I/O device 11200 may include a keypad, a keyboard, a display device and the like. The memory device 11300 may store data and/or commands. The interface 11400 may serve to transmit data receive data to or from a communication network. The interface 11400 may be a wired or wireless interface. For example, the interface 11400 may include an antenna or a wired or wireless transceiver. Although it is not illustrated, the electronic system 11000 may further include a high-speed DRAM or SRAM, as an operating memory for improving the operation of the controller 11100. The semiconductor device 1 to 11 manufactured according to principle of inventive concepts may be provided in the memory device 11300 or may be provided as a part of the controller 11100, the I/O device 11200 or the like.

The electronic system 11000 may be applied to a personal digital assistant (PDA), a portable computer, a web tablet, a wireless phone, a smart phone, a mobile phone, a digital music player, a memory card or all types of electronic products capable of transmitting or receiving information in a wireless environment.

Figure 22:
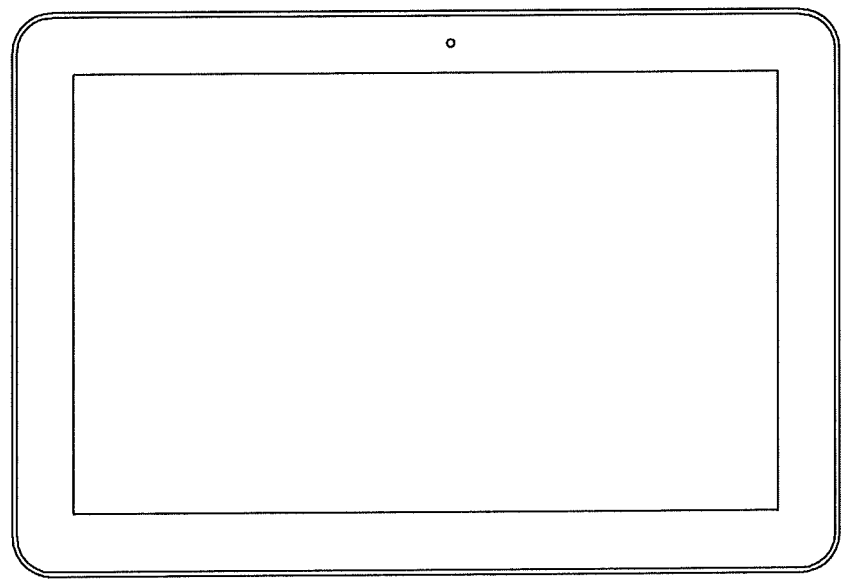
FIG. 22 is an exemplary semiconductor system to which the semiconductor device and the semiconductor package according to some example embodiments of the present invention are applicable.

FIG. 22 is an exemplary semiconductor system to which the semiconductor device and the semiconductor package according to some example embodiments in accordance with principles of inventive concepts are applicable.

FIG. 22 illustrates a tablet PC. The semiconductor device 1 to 6 and the semiconductor package 7 to 10 according to some example embodiments of inventive concepts may be used in a tablet PC, a laptop computer and the like. It will be apparent to those skilled in the art that a semiconductor device manufactured according to some example embodiments of inventive concepts may also be applied to other integrated circuit devices that are not illustrated.

While inventive concepts have been particularly illustrated and described with reference to exemplary embodiments thereof, it will be understood by those of ordinary skill in the art that various changes in form and detail may be made therein without departing from the scope of inventive concepts as defined by the following claims. The exemplary embodiments should be considered in a descriptive sense only and not for purposes of limitation.

What is claimed is:

1. A semiconductor package comprising:
a package substrate including a top pad on a top surface;
a semiconductor chip disposed on the package substrate; and
a bump disposed between the package substrate and the semiconductor chip,
wherein the semiconductor chip comprises a semiconductor chip body including a chip pad on a surface facing the top surface of the package substrate, a passivation film disposed on the semiconductor chip body, and a redistribution layer disposed between the passivation film and the semiconductor chip body,
openings in the passivation film expose a chip center pad region of the redistribution layer at least partially overlapping the chip pad, expose a redistribution center pad region of the redistribution layer connected to the chip center pad region, and expose an edge pad region of the redistribution layer spaced apart from the redistribution center pad region, through the passivation film,
a surface of the chip center pad region facing the top surface of the package substrate is not disposed on a same plane with a surface of the redistribution center pad region facing the top surface of the package substrate, and
the bump connects the redistribution center pad region with the top pad, the bump positioned adjacent to a single side of the chip center pad region.

2. The semiconductor package of claim 1, wherein the redistribution center pad region and the chip center pad region are connected to each other to have a profile continuous with each other.

3. The semiconductor package of claim 1, further comprising:
an insulating film disposed between the redistribution center pad region and the semiconductor chip body,
wherein the top surface of the chip pad is exposed through the insulating film.

4. The semiconductor package of claim 3, wherein the chip center pad region comprises a center region and a peripheral region that connects the center region with the redistribution center pad region, and
a surface of the center region facing the top surface of the package substrate is not disposed on a same plane with the surface of the redistribution center pad region facing the top surface of the package substrate.

5. The semiconductor package of claim 4, wherein the surface of the redistribution center pad region has an area greater than the surface of the center region.

6. The semiconductor package of claim 1, wherein a distance between the redistribution center pad region and the package substrate is smaller than a distance between the chip center pad region and the package substrate.

7. The semiconductor package of claim 1, further comprising a flip pad disposed on the redistribution center pad region,
wherein the bump electrically connects the flip pad with the top pad.

8. The semiconductor package of claim 1, wherein the surface of the redistribution center pad region has a first length, and
the surface of the chip center pad region has a second length smaller than the first length.

9. The semiconductor package of claim 1, wherein sidewalls of an opening exposing the redistribution center pad region of the redistribution layer extend beyond sidewalls of the chip pad.

10. A semiconductor package comprising:
a package substrate including a first top pad on a top surface;
a semiconductor chip disposed on the package substrate, the semiconductor chip including:
a semiconductor chip body including a chip pad on a surface facing the top surface of the package substrate,
a passivation film disposed on the semiconductor chip body, and
a redistribution layer disposed between the passivation film and the semiconductor chip body,
wherein openings in the passivation film expose a chip center pad region of the redistribution layer at least partially overlapping the chip pad, and expose a redistribution center pad region of the redistribution layer connected to the chip center pad region and at least partially not overlapping the chip pad, and expose an edge pad region of the redistribution layer spaced apart from the redistribution center pad region, through the passivation film;

a first flip pad overlapping the redistribution center pad region; and a first bump connecting the first flip pad with the first top pad.

11. The semiconductor package of claim 10, wherein a surface of the chip center pad region facing the top surface of the package substrate is not disposed on a same plane with a surface of the redistribution center pad region facing the top surface of the package substrate.

12. The semiconductor package of claim 11, wherein a distance between the redistribution center pad region and the package substrate is smaller than a distance between the chip center pad region and the package substrate.

13. The semiconductor package of claim 10, wherein an interface between the passivation film and the redistribution layer is disposed on a same plane with an interface between the first flip pad and the redistribution layer.

14. The semiconductor package of claim 13, further comprising:

a second flip pad overlapping the redistribution center pad region and spaced apart from the first flip pad; and a second bump connecting the second flip pad with a second top pad, the package substrate including the second top pad on the top surface, and the second top pad spaced apart from the first top pad.

15. The semiconductor package of claim 14, wherein the redistribution layer extends on the semiconductor chip body along a first direction, the redistribution center pad region includes first and second sub-center pad regions that are disposed along the direction around the chip center pad region, and the first flip pad overlaps the first sub-center pad region, and the second flip pad overlaps the second sub-center pad region.

16. The semiconductor package of claim 10, wherein the redistribution center pad region and the chip center pad region are connected to each other to have a profile continuous with each other.

17. The semiconductor package of claim 10, further comprising:

an insulating film disposed between the redistribution center pad region and the semiconductor chip body, wherein the top surface of the chip pad is exposed through the insulating film.

18. The semiconductor package of claim 17, wherein the chip center pad region comprises a center region and a peripheral region that connects the center region with the redistribution center pad region, and a surface of the center region facing the top surface of the package substrate is not disposed on a same plane with the surface of the redistribution center pad region facing the top surface of the package substrate.

19. The semiconductor package of claim 18, wherein the surface of the redistribution center pad region has an area greater than the surface of the center region.

20. The semiconductor package of claim 10, wherein sidewalls of an opening exposing the redistribution center pad region of the redistribution layer extend beyond sidewalls of the chip pad.

* * * * *